US012220055B2

(12) United States Patent
Chen et al.

(10) Patent No.: US 12,220,055 B2
(45) Date of Patent: Feb. 11, 2025

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 85 days.

(21) Appl. No.: 18/198,293

(22) Filed: May 17, 2023

(65) Prior Publication Data

US 2024/0215723 A1    Jul. 4, 2024

(30) Foreign Application Priority Data

Dec. 28, 2022   (TW) .................................. 111150804

(51) Int. Cl.
*A47B 88/49*     (2017.01)
*A47B 88/447*    (2017.01)

(52) U.S. Cl.
CPC ............ *A47B 88/49* (2017.01); *A47B 88/447* (2017.01); *A47B 2210/0067* (2013.01)

(58) Field of Classification Search
CPC ....... A47B 88/473; A47B 88/49; A47B 88/57; A47B 2210/007; A47B 2210/0081; A47B 2210/0016; A47B 88/477; A47B 2210/0064; A47B 2210/0067; A47B 88/447; H05K 7/1489

See application file for complete search history.

(56) References Cited

U.S. PATENT DOCUMENTS

| | | | |
|---|---|---|---|
| 9,861,197 B2 * | 1/2018 | Chen | A47B 88/43 |
| 9,992,906 B2 * | 6/2018 | Chen | A47B 88/57 |
| 10,743,658 B1 * | 8/2020 | Chen | A47B 88/447 |
| 10,806,255 B1 * | 10/2020 | Chen | A47B 88/443 |
| 10,918,209 B1 * | 2/2021 | Chen | H05K 7/1489 |
| 11,009,069 B1 * | 5/2021 | Chen | A47B 88/49 |
| 11,641,939 B2 | 5/2023 | Chen | |
| 11,641,940 B2 | 5/2023 | Chen | |

(Continued)

FOREIGN PATENT DOCUMENTS

| | | |
|---|---|---|
| JP | 2018-187344 A | 11/2018 |
| JP | 2019-81083 A | 5/2019 |

(Continued)

*Primary Examiner* — Hiwot E Tefera
(74) *Attorney, Agent, or Firm* — Winston Hsu

(57) ABSTRACT

A slide rail assembly includes a supporting frame, a first rail, a second rail and a third rail. The first rail is movable relative to the supporting frame. The second rail is movable relative to the first rail. The third rail is movable relative to the second rail. When the slide rail assembly is at an extending state, the first rail is located at a predetermined position relative to the supporting frame, the second rail is located at an extended position relative to the first rail, the third rail is located at an opened position relative to the second rail and a rear rail section of the third rail is overlapped with a front rail section of the first rail.

14 Claims, 17 Drawing Sheets

(56) References Cited

U.S. PATENT DOCUMENTS

| | | | | |
|---|---|---|---|---|
| 2004/0227441 A1* | 11/2004 | Wang | ............... | A47B 88/49 |
| | | | | 312/334.8 |
| 2006/0029304 A1* | 2/2006 | Chen | ............... | A47B 88/493 |
| | | | | 384/18 |
| 2012/0087604 A1* | 4/2012 | Yu | ............... | H05K 7/1489 |
| | | | | 384/18 |
| 2013/0129267 A1* | 5/2013 | Chen | ............... | A47B 88/40 |
| | | | | 384/20 |
| 2016/0278521 A1* | 9/2016 | Chen | ............... | A47B 88/42 |
| 2017/0254586 A1* | 9/2017 | Hwang | ............... | A47B 88/493 |
| 2018/0070723 A1* | 3/2018 | Chen | ............... | F16C 29/04 |
| 2018/0092462 A1* | 4/2018 | Chen | ............... | A47B 88/493 |
| 2019/0159593 A1* | 5/2019 | Chen | ............... | A47B 88/40 |
| 2019/0200759 A1* | 7/2019 | Chen | ............... | H05K 7/1489 |
| 2021/0120951 A1* | 4/2021 | Chen | ............... | A47B 88/57 |
| 2021/0120952 A1* | 4/2021 | Borquez | ............... | A47B 88/427 |
| 2021/0145176 A1* | 5/2021 | Choi | ............... | A47B 88/493 |
| 2021/0267370 A1* | 9/2021 | Kanipe | ............... | A47B 88/477 |
| 2022/0061528 A1* | 3/2022 | Chen | ............... | A47B 88/49 |
| 2022/0240673 A1* | 8/2022 | Chen | ............... | A47B 88/49 |

FOREIGN PATENT DOCUMENTS

| | | |
|---|---|---|
| JP | 2020-11032 A | 1/2020 |
| JP | 2021-30057 A | 3/2021 |
| JP | 2021-79077 A | 5/2021 |
| TW | I723808 B | 4/2021 |

* cited by examiner

SLIDE RAIL ASSEMBLY

BACKGROUND OF THE INVENTION

1. Field of the Invention

The present invention relates to a slide rail assembly, and more specifically, to a slide rail assembly having at least four rails and capable of supporting two of the at least four rails by each other when the slide rail assembly is in an extended state.

2. Description of the Prior Art

US Patent Publication No. 2012/0087604 A1 discloses a slide rail assembly including an outer frame, an outer rail accommodated inside the outer frame, a middle frame mounted inside the outer rail and an inner rail mounted inside the middle rail. The middle rail is located between the outer rail and the inner rail. The outer frame includes a fixing plate, an upper arm and a lower arm. The upper arm and the lower arm are formed on the fixing plate symmetrically and bent from an upper side and a lower side respectively. An end portion of the upper arm is bent downwardly and parallel to the fixing plate. An end portion of the lower arm is bent upwardly and parallel to the fixing plate. The upper arm and the lower arm of the outer frame can cooperatively position the outer rail for preventing the outer rail from falling out of outer frame.

However, the slide rail assembly disclosed by U.S. Patent Publication No. 2012/0087604 A1 is not strong enough to support a heavy object stably when being in an extended state. To meet different requirements, it becomes an important topic to provide a slide rail assembly having at least four rails and enough supporting capability when the slide rail assembly is in an extended state.

SUMMARY OF THE INVENTION

The present invention provides a slide rail assembly having at least four rails and capable of supporting two of the at least four rails by each other when the slide rail assembly is in an extended state.

According to an aspect of the present invention, a slide rail assembly includes a supporting frame, a first rail, a second rail and a third rail. The first rail is movable relative to the supporting frame. The second rail is movable relative to the first rail. The third rail is movable relative to the second rail. When the slide rail assembly is in an extended state, the first rail is located at a first predetermined position relative to the supporting frame, the second rail is located at an extended position relative to the first rail, the third rail is located at an opened position relative to the second rail and a rear rail section of the third rail is overlapped with a front rail section of the first rail.

Preferably, each of the supporting frame, the first rail, the second rail and the third rail includes a front portion and a rear portion. The supporting frame further includes a supporting channel configured to at least partially accommodate the first rail. The first rail further includes a first channel configured to at least partially accommodate the second rail, and the second rail further includes a second channel configured to at least partially accommodate the third rail.

Preferably, when the slide rail assembly is in the extended state, the front portion of the first rail extends beyond the front portion of the supporting frame, the front portion of the second rail extends beyond the front portion of the first rail, and the front portion of the third rail extends beyond the front portion of the second rail.

Preferably, when the slide rail assembly is in the extended state, the front portion of the second rail extends beyond the rear portion of the third rail.

Preferably, the supporting frame further includes a first wall, a second wall and a longitudinal wall connected between the first wall and the second wall of the supporting frame, and the supporting channel is defined by the first wall, the second wall and the longitudinal wall of the supporting frame cooperatively.

Preferably, each of the first wall and the second wall of the supporting frame includes a first supporting portion and a second supporting portion bent relative to the first supporting portion. Each of the longitudinal wall of the supporting frame and the first supporting portion has a first predetermined thickness, and the second supporting portion has a second predetermined thickness less than the first predetermined thickness.

Preferably, the first rail further includes a first wall, a second wall and a longitudinal wall connected between the first wall and the second wall of the first rail. The first channel is defined by the first wall, the second wall and the longitudinal wall of the first rail cooperatively, and the first wall, the second wall and the longitudinal wall of the supporting frame are configured to at least partially cover the first wall, the second wall and the longitudinal wall of the first rail.

Preferably, the second rail further includes a first wall, a second wall and a longitudinal wall connected between the first wall and the second wall of the second rail. The second channel is defined by the first wall, the second wall and the longitudinal wall of the second rail cooperatively, and the third rail further includes a first wall, a second wall and a longitudinal wall connected between the first wall and the second wall of the third rail.

Preferably, the second supporting portion includes a first surface. The longitudinal wall of the third rail includes a second surface, and the first surface and the second surface are not coplanar.

Preferably, a blocking structure and a positioning structure are arranged on the supporting frame. A blocking feature and a positioning feature are arranged on the first rail. The second rail is movably mounted between the first rail and the third rail. The slide rail assembly further includes a first working member and a second working member. The first working member is movably mounted to the first rail and switchable between a first state and a second state. The second working member is movably mounted to the first rail and switchable between a third state and a fourth state. When the first rail is located at the first predetermined position relative to the supporting frame, the blocking structure blocks the first working member in the first state for preventing the first rail from moving along a retracting direction from the first predetermined position, and when the first rail is located at a second predetermined position relative to the supporting frame, the second working member in the third state engages with the positioning structure for preventing the first rail from moving along an opening direction from the second predetermined direction.

Preferably, the first working member and the second working member are pivotally connected to the first rail, and the slide rail assembly further includes a first resilient member and a second resilient member respectively configured to provide resilient forces to the first working member and the second working member.

Preferably, when the first rail is located at the first predetermined position relative to the supporting frame and the first working member moves from the first state to the second state, the blocking structure does not block the first working member in the second state for allowing the first rail to move along the retracting direction from the first predetermined position to the second predetermined position.

Preferably, when the first rail is located at the second predetermined position relative to the supporting frame and the third rail is located at a retracted position relative to the first rail, the third rail is configured to support the second working member, such that the second working member is retained in the fourth state and does not engage with the positioning structure for allowing the first rail to move along the opening direction from the second predetermined position.

Preferably, a supporting feature is arranged on the first rail and configured to support the third rail when the third rail is located at the retracted position relative to the first rail.

Preferably, the third rail includes a synchronizing feature, and the synchronizing feature abuts against the first working member for allowing the third rail and the first rail to move along the opening direction synchronously during a movement of the third rail along the opening direction from the retracted position.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure (s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
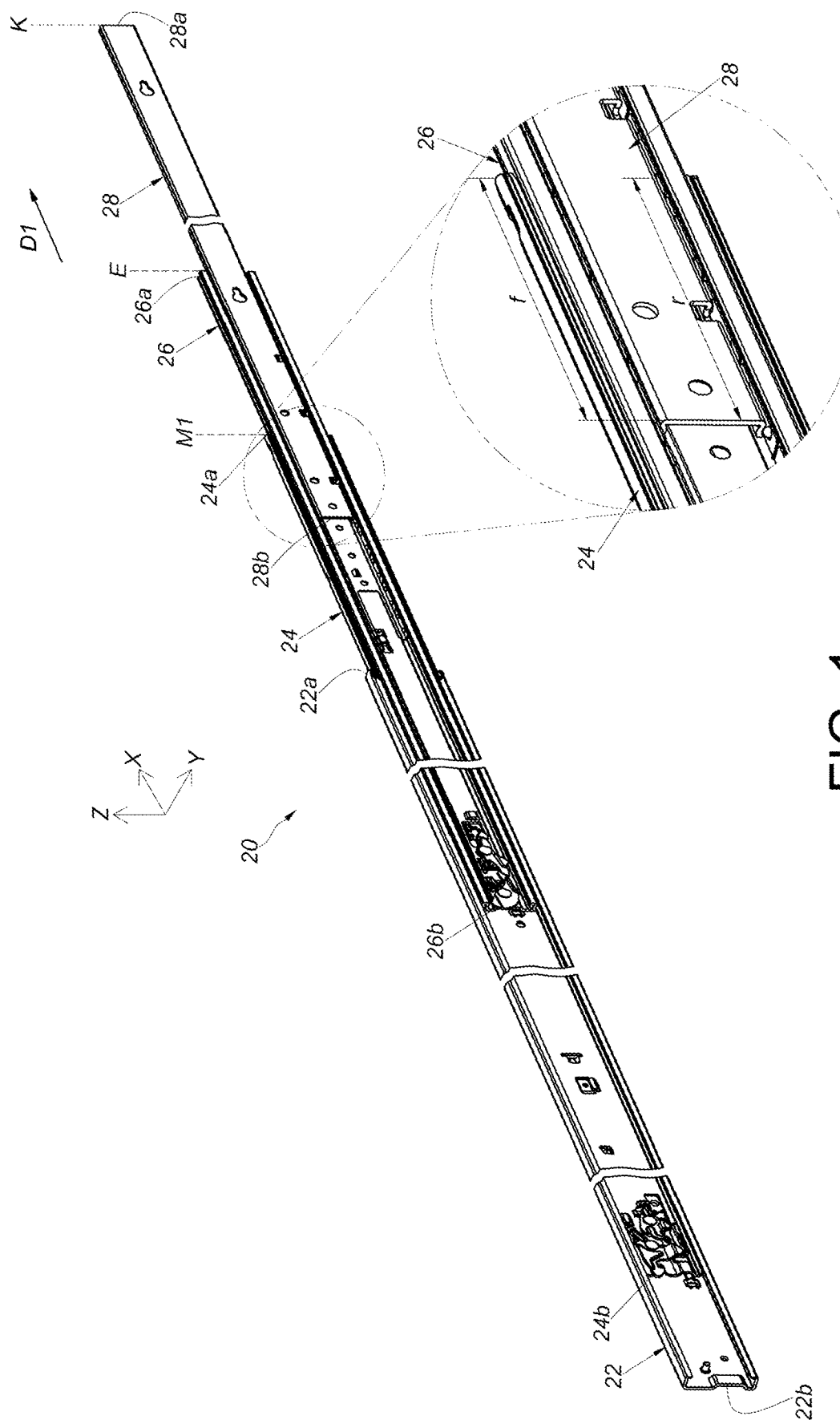
FIG. 1 is a schematic diagram of a slide rail assembly according to an embodiment of the present invention.

As shown in FIG. 1, a slide rail assembly 20 can be a multi-section rail assembly. In this embodiment, the slide rail assembly 20 can be a four-section rail assembly. Specifically, the slide rail assembly 20 includes a supporting frame 22, a first rail 24, a second rail 26 and a third rail 28. The second rail 26 is movably mounted between the first rail 24 and the third rail 28. For example, the first rail 24 can be an outer rail. The second rail 26 can be a middle rail. The third rail 28 can be an inner rail. The supporting frame 22 can be a fourth rail, which is used as a reinforced rail or a fixed rail. The supporting frame 22, the first rail 24, the second rail 26 and the third rail 28 can move relative to one another longitudinally. However, the present invention is not limited to this embodiment. For example, in another embodiment, the slide rail assembly can be a five-section rail assembly which includes an additional rail movably mounted on the supporting frame or the third rail.

More specifically, the supporting frame 22 includes a front portion 22a and a rear portion 22b. The first rail 24 includes a front portion 24a and a rear portion 24b. The second rail 26 includes a front portion 26a and a rear portion 26b. The third rail 28 includes a front portion 28a and a rear portion 28b.

When the slide rail assembly 20 is in an extended state, e.g., a fully extended state, the first rail 24 is located at a first predetermined position M1 relative to the supporting frame 22, the second rail 26 is located at an extended position E relative to the first rail 24, the third rail 28 is located at an opened position K relative to the second rail 26 and a rear rail section r of the third rail 28 is overlapped with a front rail section f of the first rail 24, such that the front rail section f of the first rail 24 and the rear rail section r of the third rail 28 can support each other for enhancing a structural strength of the slide rail assembly 20. Preferably, when the slide rail assembly 20 is in the extended state, the front portion 24a of the first rail 24 extends beyond the front portion 22a of the supporting frame 22 along an opening direction D1, the front portion 26a of the second rail 26 extends beyond the front portion 24a of the first rail 24 along the opening direction D1, the front portion 28a of the third rail 28 extends beyond the front portion 26a of the second rail 26 along the opening direction D1. More preferably, when the slide rail assembly 20 is in the extended state, the front portion 26a of the second rail 26 extends beyond the rear portion 28b of the third rail 28 along the opening direction D1.

It should be noticed that, in this embodiment, a longitudinal direction of the rail, i.e., a length direction or a moving direction of rail, can be parallel to an X axis. A transverse direction of the rail, i.e., a lateral direction of the rail, can be parallel to a Y axis. A vertical direction of the rail, i.e., a height direction of the rail, can be parallel to a Z axis.

Figure 2:
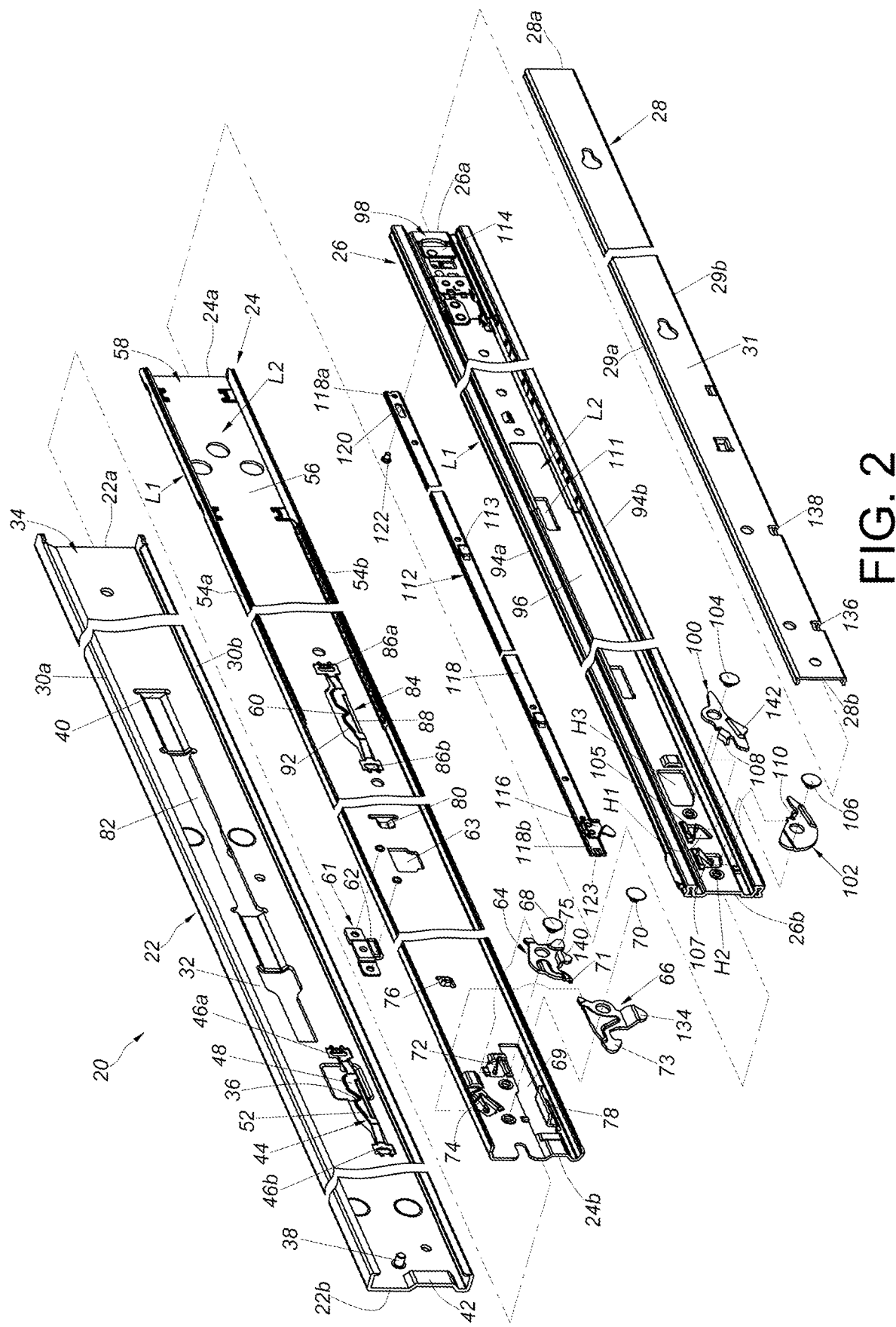
FIG. 2 is an exploded diagram of the slide rail assembly according to the embodiment of the present invention.
Figure 3:
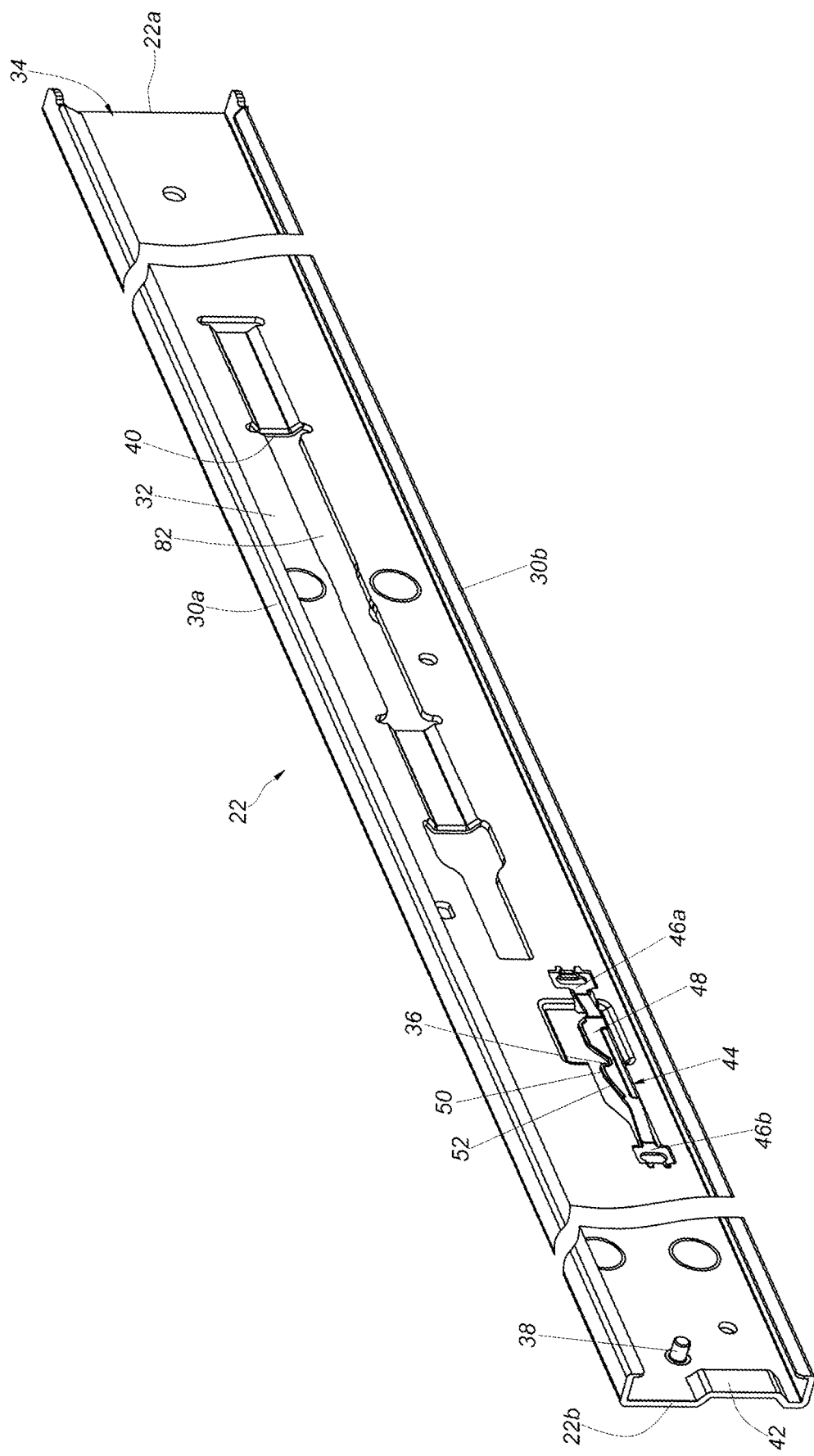
FIG. 3 is a diagram of a supporting frame according to the embodiment of the present invention.

As shown in FIG. 2 and FIG. 3, the supporting frame 22 further includes a first wall 30a, a second wall 30b and a longitudinal wall 32 connected between the first wall 30a and the second wall 30b of the supporting frame 22. The first wall 30a, the second wall 30b and the longitudinal wall 32 of the supporting frame 22 cooperatively define a supporting channel 34 of the supporting frame 22. The supporting channel 34 is configured to at least partially accommodate the first rail 24. A blocking structure 36 and a positioning structure 38 are arranged on the supporting frame 22.

Preferably, the supporting frame 22 further includes a front restraining feature 40 and a rear restraining feature 42. The front restraining feature 40 and the rear restraining feature 42 are configured to restrain a travel distance of the first rail 24. For example, the front restraining feature 40 and the rear restraining feature 42 can be protruding walls or protruding portions. However, the present invention is not limited thereto. Besides, the blocking structure 36 and the positioning structure 38 are located between the front restraining feature 40 and the rear restraining feature 42. In this embodiment, the front restraining feature 40, the blocking structure 36, the positioning feature 38 and the rear restraining feature 42 can be sequentially arranged on the longitudinal wall 32 of the supporting frame 22 from front to rear.

Preferably, the slide rail assembly 20 further includes an auxiliary resilient seat 44 arranged on the supporting frame 22. The auxiliary resilient seat 44 includes a first fixing portion 46a, a second fixing portion 46b and a middle portion 48. The first fixing portion 46a and the second fixing portion 46b are connected to the longitudinal wall 32 of the supporting frame 22. The middle portion 48 is located between the first fixing portion 46a and the second fixing portion 46b. The middle portion 48 includes the blocking structure 36, a longitudinal section 50 and a guiding section 52. The longitudinal section 50 is located between the blocking structure 36 and the guiding section 52. For example, the blocking structure 36 can be a blocking wall or an erecting wall, and the guiding section 52 can be an inclined surface or an arc surface. However, the present invention is not limited thereto.

Preferably, for example, the positioning feature 38 can be formed in a column shape or a protrusion. However, the present invention is not limited thereto.

Figure 4:
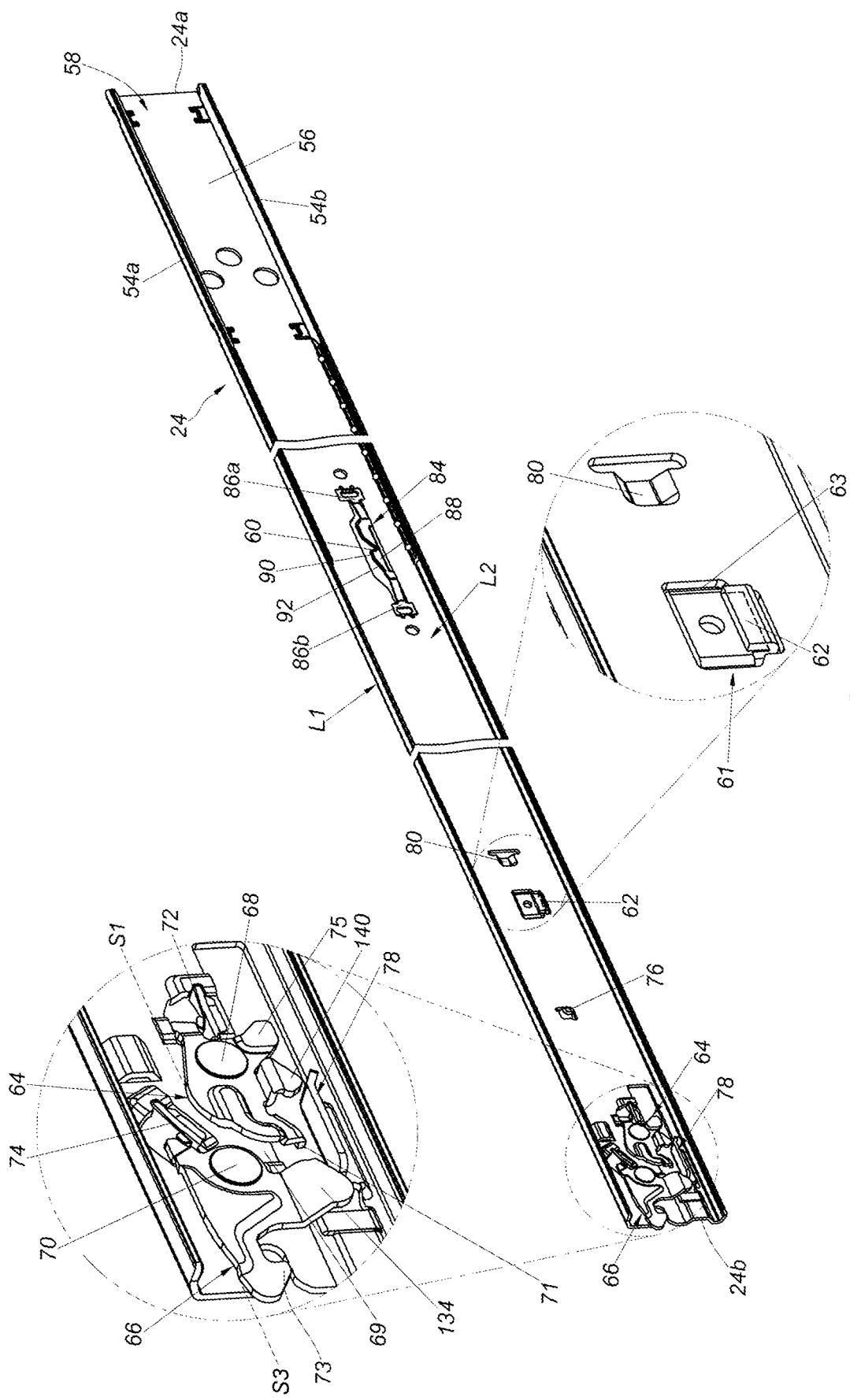
FIG. 4 is a diagram of a first rail according to the embodiment of the present invention.

As shown in FIG. 2 and FIG. 4, the first rail 24 is at least partially movably mounted inside the supporting channel 34 of the supporting frame 22 and movable relative to the supporting frame 22. The first rail 24 further includes a first wall 54a, a second wall 54b and a longitudinal wall 56 connected between the first wall 54a and the second wall 54b of the first rail 24. The first wall 54a, the second wall 54b and the longitudinal wall 56 of the first rail 24 cooperatively define a first channel 58 of the first rail 24. The first channel 58 is configured to at least partially accommodate the second rail 26. The first rail 24 further includes a first side L1 and a second side L2 opposite to the first side L1. The first side L1 of the first rail 24 is located adjacent to the supporting frame 22. The second side L2 of the first rail 24 is located adjacent to the second rail 26. A blocking feature 60 and a positioning feature 62 are arranged on the first rail 24. In this embodiment, a positioning member 61 can be arranged on the first rail 24 and connected, e.g., fixedly connected, to the first side L1 of the first rail 24. The positioning member 61 can include the positioning feature 62. The positioning feature 62 can extend from the first side L1 of the first rail 24 to the second side L2 of the first rail 24 through an auxiliary hole 63 on the first rail 24. However, the present invention is not limited to this embodiment. For example, in another embodiment, the positioning feature can be a protrusion arranged on the second side of the first rail.

The slide rail assembly 20 further includes a first working member 64 and a second working member 66. The first working member 64 is movably mounted on the first rail 24 and switchable between a first state S1 and a second state S2 relative to the first rail 24. The second working member 66 is movably mounted on the first rail 24 and switchable between a third state S3 and a fourth state S4 relative to the first rail 24. In this embodiment, the first working member 64 and the second working member 66 can be respectively pivotally connected to the longitudinal wall 56 of the first rail 24 by a first pivoting member 68 and a second pivoting member 70 and located at the second side L2 of the first rail 24. However, the present invention is not limited to this embodiment.

Preferably, the first rail 24 further includes an opening 69 communicated with the first side L1 and the second side L2 of the first rail 24. The first working member 64 includes a blocking portion 71 extending to the first side L1 of the first rail 24 through the opening 69. The blocking portion 71 is configured to cooperate with the blocking structure 36 of the supporting frame 22. The second working member 66 includes a positioning portion 73 configured to cooperate with the positioning structure 38 of the supporting frame 22. For example, the positioning portion 73 can be an engaging hook. However, the present invention is not limited thereto.

Preferably, the first working member 64 further includes a releasing portion 75 configured to cooperate with the second rail 26.

Preferably, the slide rail assembly 20 further includes a first resilient member 72 and a second resilient member 74 respectively configured to provide resilient forces to the first working member 64 and the second working member 66 to drive the first working member 64 and the second working member 66 to move to the first state S1 and the third state S3 relative to the first rail 24.

Preferably, a first auxiliary feature 76 and a supporting feature 78 are arranged on the first rail 24. The blocking feature 60, the positioning feature 62, the first auxiliary feature 76, the first working member 64 and the second working member 66 are sequentially arranged on the longitudinal wall 56 of the first rail 24 from front to rear.

Preferably, the first rail 24 further includes a front restraining portion 80 and a rear restraining portion respectively configured to cooperate with the front restraining feature 40 and the rear restraining feature 42 of the supporting frame 22 for restraining a travel distance of the first rail 24 relative to the supporting frame 22. In this embodiment, the front restraining portion 80 can be a protruding block located on the first side S1 of the first rail 24 and facing toward the longitudinal wall 32 of the supporting frame 22, and the front restraining portion 80 can stretch into a longitudinal space 82 of the longitudinal wall 32 of the supporting frame 22, e.g., a longitudinal slot of the longitudinal wall 32 of the supporting frame 22, so as to be located at a position corresponding to the front restraining feature 40. The rear restraining portion can be the rear portion 24b. However, the present invention is not limited to this embodiment.

Preferably, the slide rail assembly 20 further includes a resilient seat 84 arranged on the first rail 24. The resilient seat 84 includes a first connecting portion 86a, a second connecting portion 86b and a supporting structure 88. The first connecting portion 86a and the second connecting portion 86b are connected to the longitudinal wall 56 of the first rail 24. The supporting structure 88 is located between the first connecting portion 86a and the second connecting portion 86b. The supporting structure 88 includes the blocking feature 60, a longitudinal portion 90 and a guiding portion 92. The longitudinal portion 90 is located between the blocking feature 60 and the guiding portion 92. For example, the blocking feature 60 can be a blocking wall or an erecting wall, and the guiding portion 92 can be an inclined surface or an arc surface. However, the present invention is not limited thereto.

Figure 5:
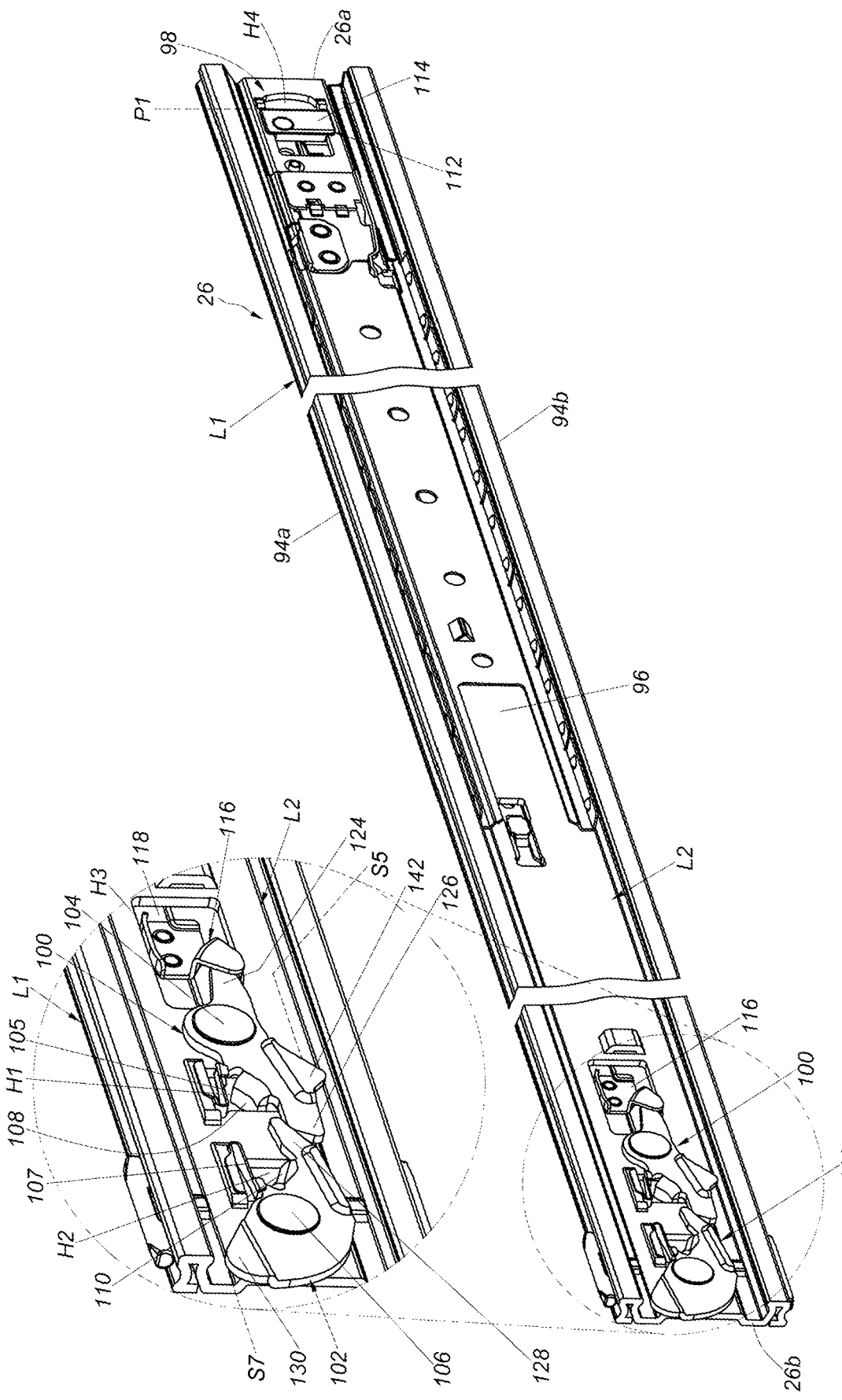
FIG. 5 and FIG. 6 are diagrams of a second rail at different views as an operating member is located at a first operated position according to the embodiment of the present invention.
Figure 6:
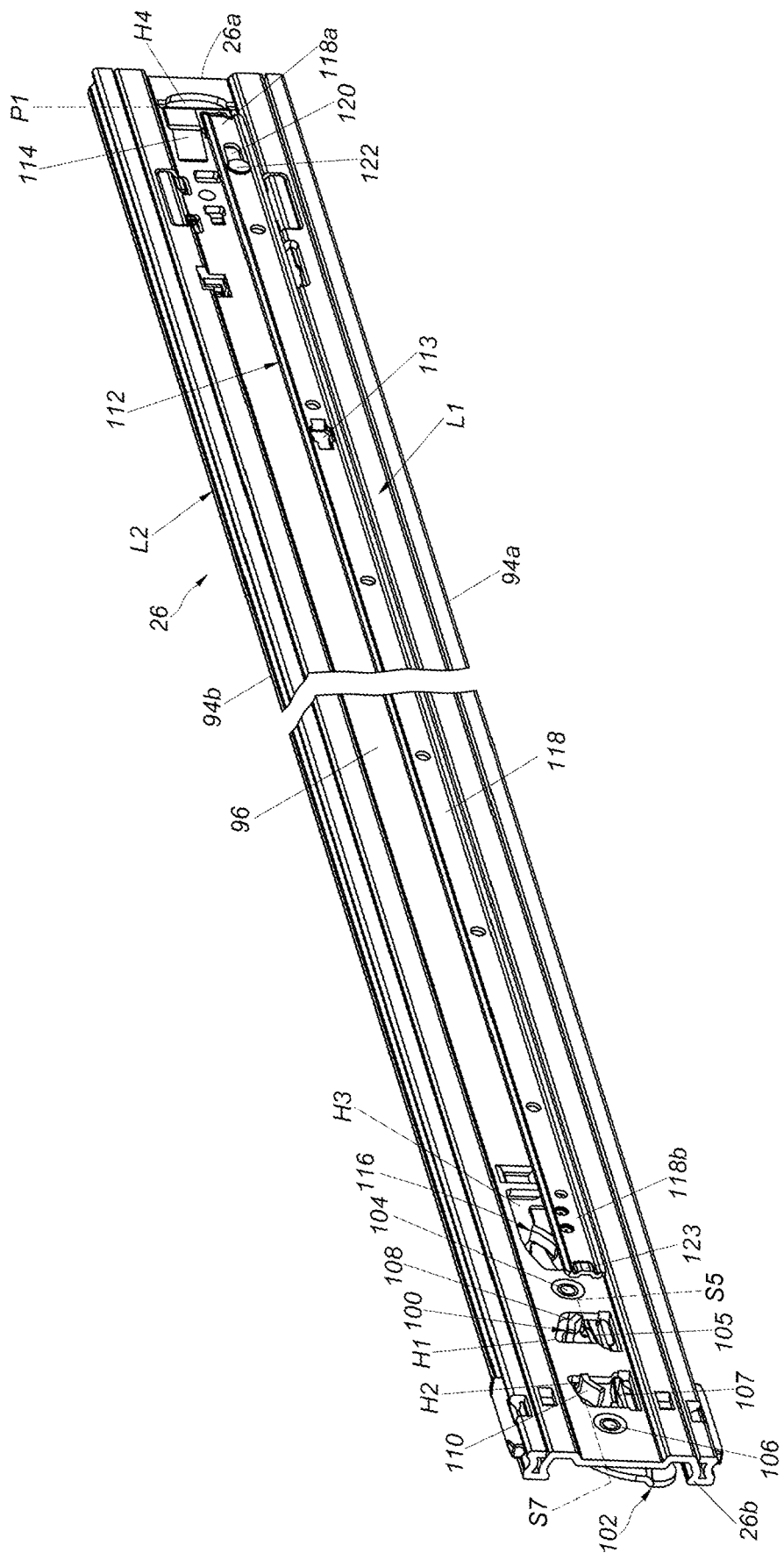

As shown in FIG. 2, FIG. 5 and FIG. 6, the second rail 26 is movable relative to the first rail 24. The second rail 26 further includes a first wall 94a, a second wall 94b and a longitudinal wall 96 connected between the first wall 94a and the second wall 94b of the second rail 26. The first wall 94a, the second wall 94b and the longitudinal wall 96 of the second rail 26 cooperatively define a second channel 98 of the second rail 26. The second channel 98 is configured to at least partially accommodate the third rail 28. The second rail 26 further includes a first side L1 and a second side L2 opposite to the first side L1. The first side L1 of the second rail 26 is located adjacent to the first rail 24. The second side L2 of the second rail 26 is located adjacent to the third rail 28.

Preferably, the slide rail assembly 20 further includes a third working member 100 and a fourth working member 102. The third working member 100 is movably mounted on the second rail 26 and switchable between a fifth state S5 and a sixth state S6 relative to the second rail 26. The fourth working member 102 is movably mounted on the second rail 26 and switchable between a seventh state S7 and a eighth state S8 relative to the second rail 26. In this embodiment, the third working member 100 and the fourth working member 102 can be respectively pivotally connected to the longitudinal wall 96 of the second rail 26 by a first shaft 104 and a second shaft 106 and located at the second side L2 of the second rail 26. However, the present invention is not limited to this embodiment.

Preferably, the slide rail assembly 20 further includes a first resilient feature 105 and a second resilient feature 107 respectively configured to provide resilient forces to the third working member 100 and the fourth working member 102 for driving the third working member 100 and the fourth working member 102 to move to the fifth state S5 and the seventh state S7 relative to the second rail 26.

Preferably, the second rail 26 further includes at least one hole arranged on the longitudinal wall 96 of the second rail 26 and communicated with the first side L1 and the second side L2 of the second rail 26. In this embodiment, the second rail 26 can include a first hole H1 and a second hole H2. Furthermore, the third working member 100 includes a first blocking section 108 stretching into the first hole H1. The first blocking section 108 faces toward the longitudinal wall 56 of the first rail 24 and is configured to cooperate with the blocking feature 60 or the positioning feature 62 of the first rail 24. The fourth working member 102 includes a second blocking section 110 stretching into the second hole H2. The second blocking section 110 faces toward the longitudinal wall 56 of the first rail 24 and is configured to cooperate with the positioning feature 62 of the first rail 24. However, the present invention is not limited to this embodiment. For example, in another embodiment, there can be only one hole arranged on the longitudinal wall of the second rail for the first blocking section and the second blocking section to pass therethrough.

Preferably, the slide rail assembly 20 further includes an operating member 112 movably mounted on the second rail 26 and configured to operate one of the third working member 100 and the fourth working member 102.

Preferably, the operating member 112 is mounted on the longitudinal wall 96 of the second rail 26 and located at the first side L1 of the second rail 26. The operating member 112 includes an operating portion 114, a driving portion 116 and an extending portion 118 connected between the operating portion 114 and the driving portion 116. The operating portion 114 is connected to a front end 118a of the extending portion 118. The operating portion 114 is located adjacent to the front portion 26a of the second rail 26. The driving portion 116 is connected to a rear end 118b of the extending portion 118. The driving portion 116 is located adjacent to the rear portion 26b of the second rail 26. Besides, the third working member 100 and the fourth working member 102 are located adjacent to the rear portion 26b of the second rail 26.

Preferably, the second rail 26 further includes a third hole H3 arranged on the longitudinal wall 96 of the second rail 26. The driving portion 116 of the operating member 112 extends from the first side L1 to the second side L2 of the second rail 26 through the third hole H3 and is located adjacent to the third working member 100.

Preferably, the second rail 26 further includes a fourth hole H4 arranged on the longitudinal wall 96 of the second rail 26. The operating portion 114 of the operating member 112 is exposed on the second side L2 of the second rail 26 via the fourth hole H4.

Preferably, the second rail 26 and the operating member 112 have corresponding restraining features cooperating with each other for restraining a travel distance of the operating member 112 relative to the second rail 26. In this embodiment, at least one elongated hole 120 can be arranged on the extending portion 118 of the operating member 112. The second rail 26 can further include at least one connecting member 122 connected to the longitudinal wall 96 of the second rail 26 and passing through a portion of the at least one elongated hole 120. Furthermore, the second rail 26 can further include at least one extending hole 111. At least one connecting section 113 can be arranged on the extending portion 118 of the operating member 112 and passes through a portion of the at least one extending hole 111. The travel distance of the operating member 112 relative to the second rail 26 can be restrained by a cooperation of the at least one elongated hole 120 and the at least one connecting member 122 and a cooperation of the at least one extending hole 111 and the at least one connecting section 113. However, the present invention is not limited to this embodiment. For example, in another embodiment, there can be only the elongated hole and the at least one connecting member cooperating with each other. Alternatively, in another embodiment, there can be only the extending hole and the connecting section cooperating with each other.

Preferably, as shown in FIG. 2 and FIG. 6, a second auxiliary feature 123 is arranged on the operating member 112 and configured to cooperate with the first auxiliary feature 76 of the first rail 24. For example, the first auxiliary feature 76 and the second auxiliary feature 123 can be protrusions. However, the present invention is not limited thereto. Besides, as shown in FIG. 6, the second auxiliary feature 123 is arranged adjacent to the rear end 118b of the extending portion 118 of the operating member 112, and the second auxiliary feature 123 and the driving portion 116 are located at two opposite sides of the extending portion 118 of the operating member 112.

When the operating member 112 is located at a first operated position P1 relative to the second rail 26 as shown in FIG. 5 and FIG. 6, the third working member 100 and the fourth working member 102 are respectively in the fifth state S3 and the seventh state S7 relative to the second rail 26.

Preferably, as shown in FIG. 5, the third working member 100 further includes an abutting portion 124 and an actuating portion 126. The first shaft 104 is located between the abutting portion 124 and the actuating portion 126. The abutting portion 124 is located at a position corresponding to the driving portion 116 of the operating member 112 and for abutting against the driving portion 116 of the operating member 112. The first blocking section 108 is located adjacent to the actuating portion 126. The first blocking section 108 extends to the first side L1 of the second rail 26. The first resilient feature 105 is configured to provide the resilient force to the third working member 100 for retaining the third working member 100 in the fifth state S5.

Preferably, as shown in FIG. 5, the fourth working member 102 includes an abutting section 128 and an actuating section 130. The second shaft 106 is located between the abutting section 128 and the actuating section 130. The second blocking section 110 is located adjacent to the abutting section 128. The second blocking section 110 extends to the first side L1 of the second rail 26. The second resilient feature 107 is configured to provide the resilient force to the fourth working member 102 for retaining the fourth working member 102 in the seventh state S7.

Figure 7:
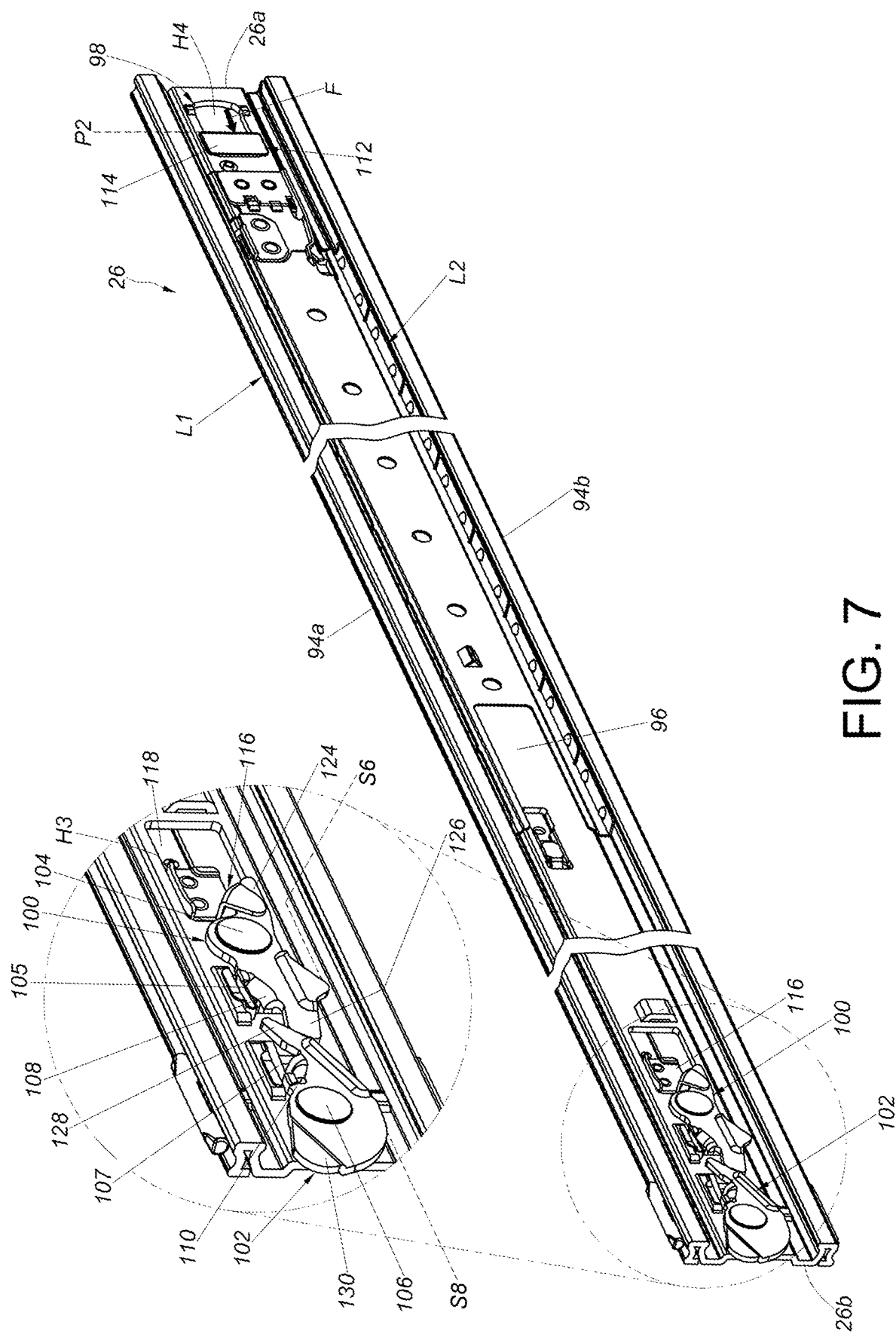
FIG. 7 and FIG. 8 are diagrams of the second rail at different views as the operating member is located at a second operated position according to the embodiment of the present invention.
Figure 8:
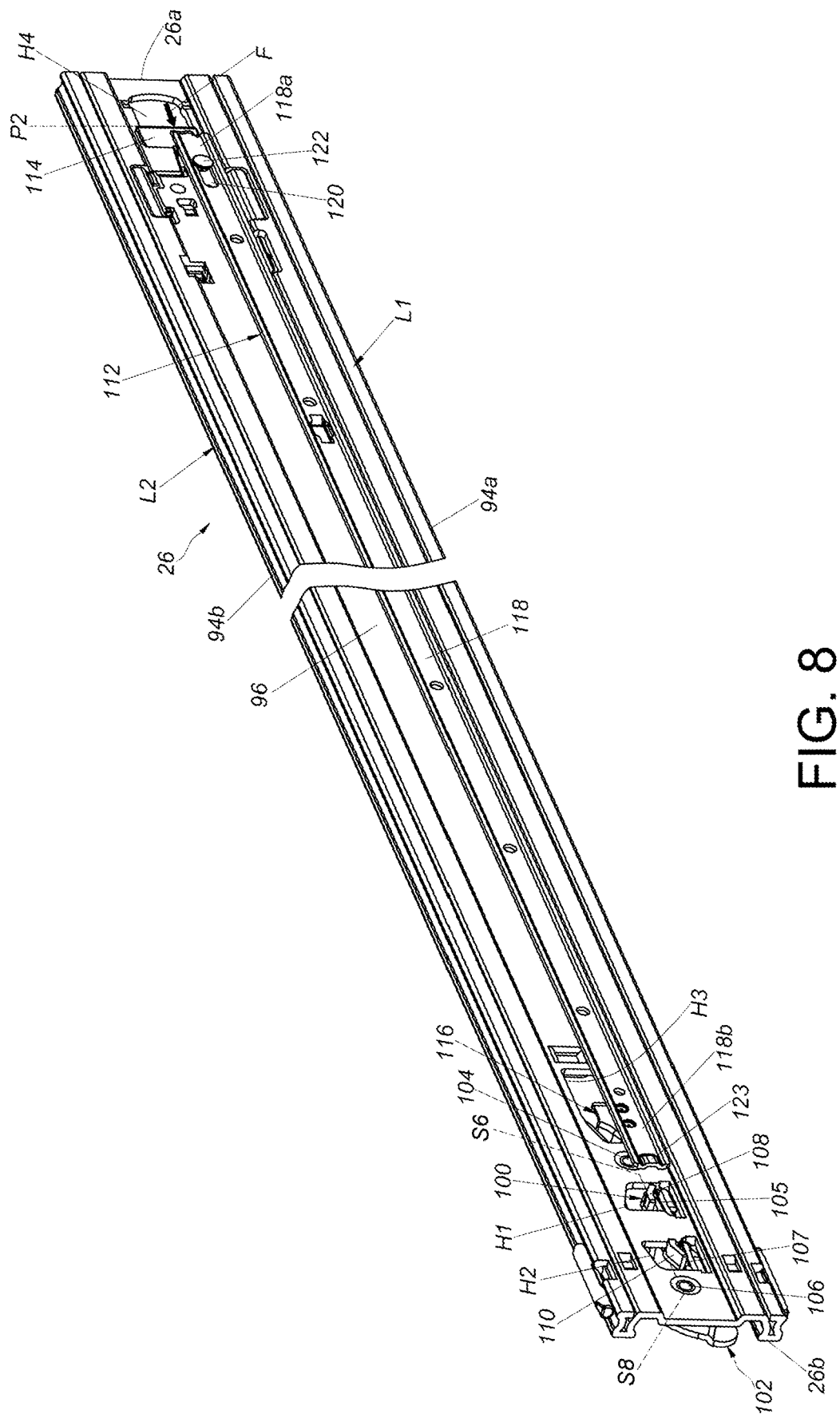

As shown in FIG. 5 to FIG. 8, the user can apply a force F onto the operating member 112, e.g., the operating portion 114 of the operating member 112, to drive the operating member 112 to move relative to the second rail 26 from the first operated position P1 to a second operated position P2. During the aforementioned process, the operating member 112 drives the third working member 100 to move, e.g., pivot, relative to the second rail 26 from the fifth state S5 as shown in FIG. 5 and FIG. 6 to the sixth state S6 as shown in FIG. 7 and FIG. 8 by an abutment of the driving portion 116 and the abutting portion 124 of the third working member 100. Preferably, when the third working member 100 moves from the fifth state S5 as shown in FIG. 5 and FIG. 6 to the sixth state S6 as shown in FIG. 7 and FIG. 8, the third working member 100 drives the fourth working member 102 to move, e.g., pivot, relative to the second rail 26 from the seventh state S7 as shown in FIG. 5 and FIG. 6 to the eighth state S8 as shown in FIG. 7 and FIG. 8 by an abutment of the actuating portion 126 and the abutting section 128 of the fourth working member 102. In other words, in this embodiment, the third working member 100 and the fourth working member 102 are configured to move synchronously, and the third working member 100 and the fourth working member 102 are respectively configured to be driven by the operating member 112 and the third working member 100. However, the present invention is not limited to this embodiment. For example, in another embodiment, the third working member and the fourth working member are configured to move synchronously, and the third working member and the fourth working member are respectively configured to be driven by the fourth working member and the operating member. Alternatively, the third working member and the fourth working member are configured to move synchronously, and the third working member and the fourth working member are configured to be driven by two driving portions of the operating member respectively. Alternatively, the slide rail assembly further includes an auxiliary operating member, and the third working member and the fourth working member are configured to be driven by the operating member and the auxiliary operating member respectively and to move asynchronously.

Preferably, as shown in FIG. 7 and FIG. 8, when the operating member 112 is located at the second operated position P2, the third working member 100 and the fourth working member 102 are respectively retained in the sixth state S6 and the eighth state S8 by an abutment of the operating member 112 and the third working member 100 and an abutment of the third working member 100 and the fourth working member 102.

Figure 9:
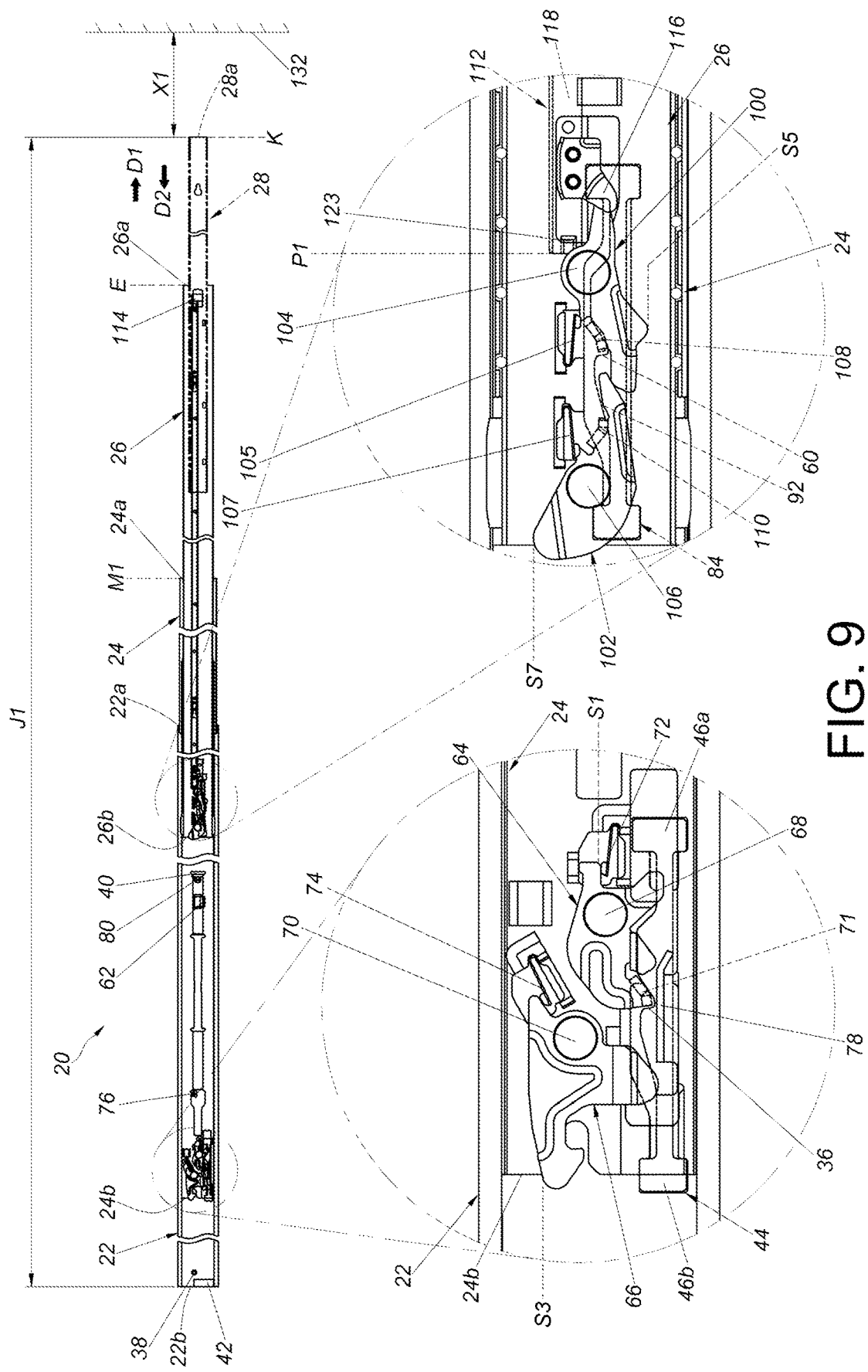
FIG. 9 is a diagram of the slide rail assembly in an extended state as the second rail is locked at an extended position according to the embodiment of the present invention.

As shown in FIG. 9, the slide rail assembly 20 is used in a limited environment and located in the extended state. As mentioned above, when the slide rail assembly 20 is located in the extended state, the first rail 24 is located at the first predetermined position M1 relative to the supporting frame 22, the second rail 26 is located at the extended position E relative to the first rail 24, and the third rail 28 is located at the opened position K1 relative to the second rail 26. At this moment, the slide rail assembly 20 has a first length J1, and a front portion 28a of the third rail 28 is spaced apart from an object 132, e.g., a door or an obstruction, by a first distance X1. The first distance X1 is too short to detach the third rail 28 from the second rail 26, e.g., the second channel 98 of the second rail 26, along the opening direction D1.

Specifically, when the first rail 24 is located at the first predetermined position M1 relative to the supporting frame 22 as shown in FIG. 9, the blocking structure 36 of the supporting frame 22 blocks the blocking portion 71 of the first working member 64 in the first state S1 for preventing the first rail 24 from moving along a retracting direction D2 from the first predetermined position M1. Besides, at this moment, the operating member 112 is located at the first operated position P1, similarly to FIG. 5 and FIG. 6. Therefore, when the second rail 26 is located at the extended position E relative to the first rail 24, the blocking feature 60 of the first rail 24 blocks the first blocking section 108 of the third working member 100 in the fifth state S5 for preventing the second rail 26 from moving along the retracting direction D2 from the extended position E, and the second blocking section 110 of the fourth working member 102 is located adjacent to the guiding portion 92 of the resilient seat 84 of the first rail 24. It should be noticed that when the third working member 100 and the fourth working member 102 are respectively in the fifth state S5 and the seventh state S7, the first blocking section 108 of the third working member 100 and the second blocking section 110 of the fourth working member 102 are located at positions where the first blocking section 108 of the third working member 100 and the second blocking section 110 of the fourth working member 102 are aligned with the positioning feature 62 of the first rail 24 along the retracting direction D2 or the opening direction D1.

Figure 10:
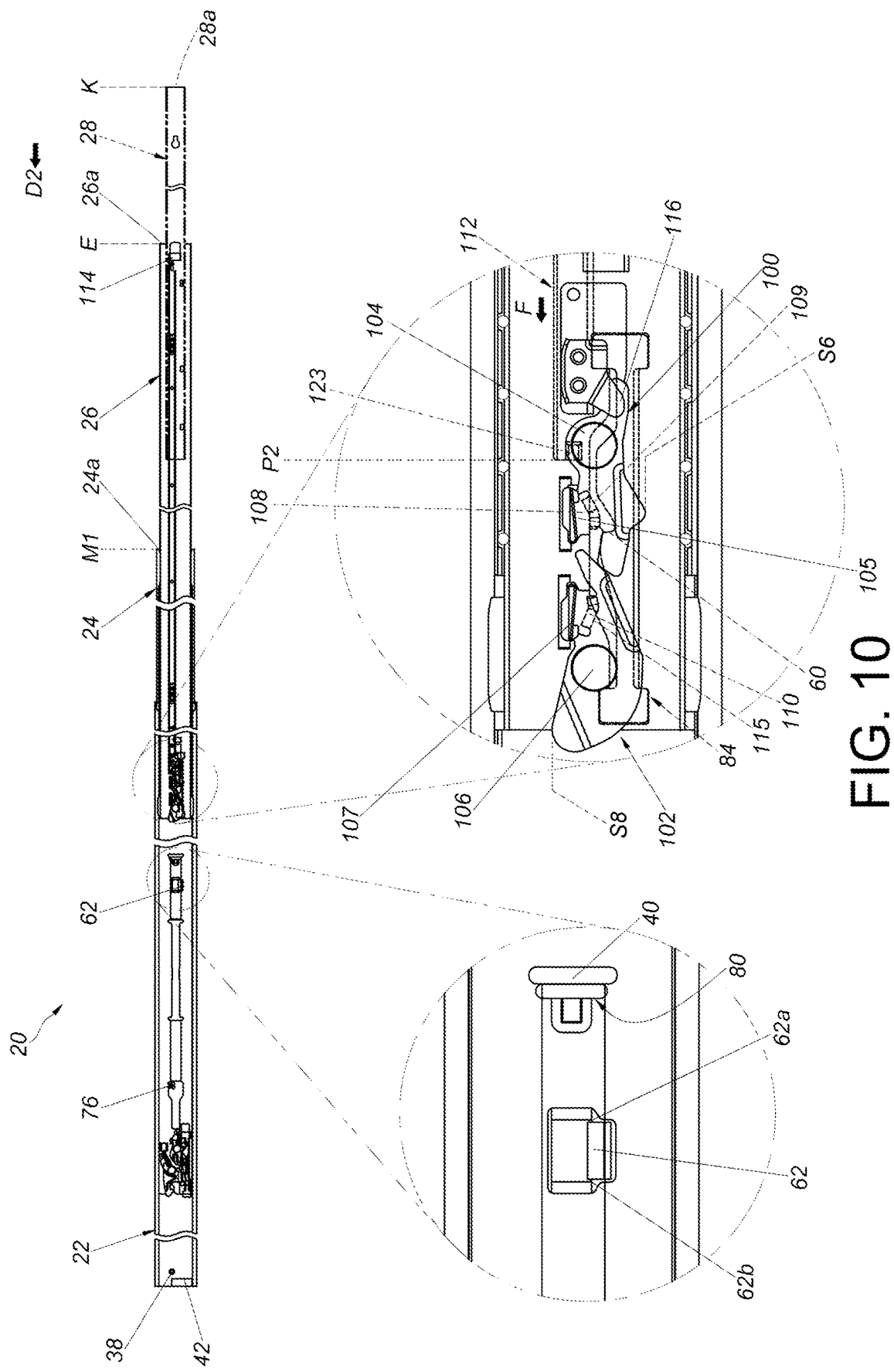
FIG. 10 is a diagram of the slide rail assembly in the extended state as the second rail is unlocked and movable along a retracting direction from the extended position according to the embodiment of the present invention.

As shown in FIG. 10, when the user applies the force F onto the operating member 112, e.g., the operating portion 114 of the operating member 112, to drive the operating member 112 to move from the first operated position P1 to the second operated position P2, the operating member 112 drives the third working member 100 by the driving portion 116 to move from the fifth state S5 to the sixth state S6, such that the blocking feature 60 cannot block the first blocking section 108 of the third working member 100 in the sixth state S6 for allowing the second rail 26 to move relative to the first rail 24 along the retracting direction D2 from the extended position E.

Furthermore, when the operating member 112 is located at the second operated position P2 as shown in FIG. 10, the third working member 100 and the fourth working member 102 are respectively retained in the sixth state S6 and the eighth state S8, such that the first resilient feature 105 and the second resilient feature 107 are resiliently deformed to generate the resilient forces, similarly to FIG. 7. Besides, when the third working member 100 and the fourth working member 102 are respectively in the sixth state S6 and the eighth state S8, the first blocking section 108 of the third working member 100 and the second blocking section 110 of the fourth working member 102 are dislocated from the positions where the first blocking section 108 of the third working member 100 and the second blocking section 110 of the fourth working member 102 are aligned with the positioning feature 62 of the first rail 24 along the retracting direction D2 or the opening direction D1. Moreover, as shown in FIG. 10, when the second rail 26 is located at the extended position E relative to the first rail 24, the second auxiliary feature 123 of the operating member 112 is separated away from the first auxiliary feature 76 of the first rail 24 by a distance.

Figure 11:
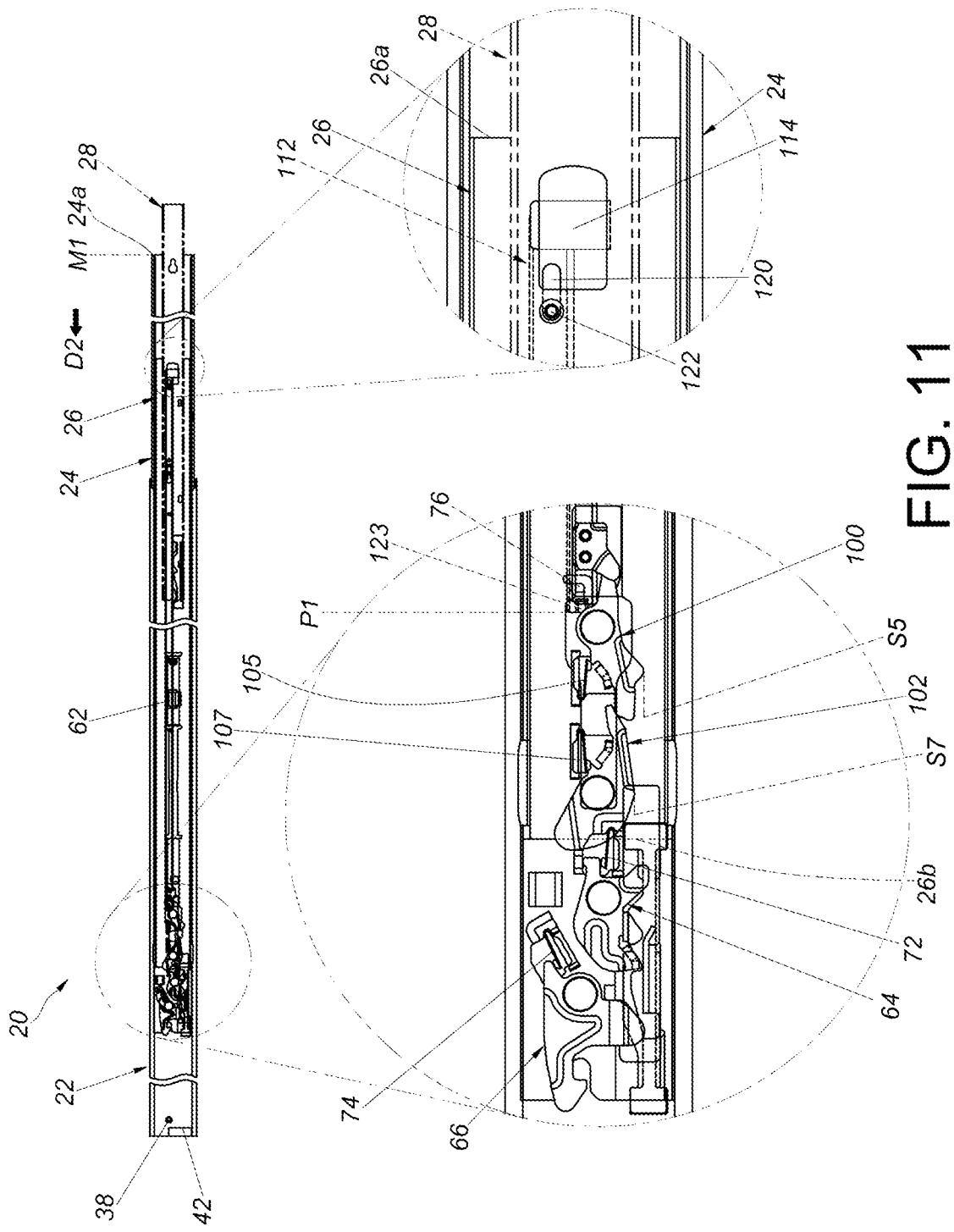
FIG. 11 is a diagram of the slide rail assembly as the second rail moves along the retracting direction according to the embodiment of the present invention.

Preferably, as shown in FIG. 10 and FIG. 11, the positioning feature 62 includes a front portion 62a and a rear portion 62b. The first blocking section 108 of the third working member 100 and the rear portion 62b of the positioning feature 62 respectively include a first guiding feature 109 and a second guiding feature 115. For example, the first guiding feature 109 and a second guiding feature 115 can be inclined surfaces or arc surfaces.

When the second rail 26 moves along the retracting direction D2 for a predetermined distance, e.g., to a position as shown in FIG. 11, the first auxiliary feature 76 of the first rail 24 abuts against the second auxiliary feature 123 of the operating member 112 to drive the operating member 112 to move from the second operated position P2 to the first operated position P1, such that the third working member 100 is driven to move from the sixth state S6 to the fifth state S5 by the first resilient feature 105, and the fourth working member 102 is driven to move from the eighth state S8 to the seventh state S7 by the second resilient feature 107. Preferably, one of the first auxiliary feature 76 and the second auxiliary feature 123 can include another guiding surface, e.g., an inclined surface or an arc surface, facing toward the other one of the first auxiliary feature 76 and the second auxiliary feature 123 to facilitate the second auxiliary feature 123 to pass over the first auxiliary feature 76 along the retracting direction D2 when the second rail 26 moves relative to the first rail 24 along the retracting direction D2.

Figure 12:
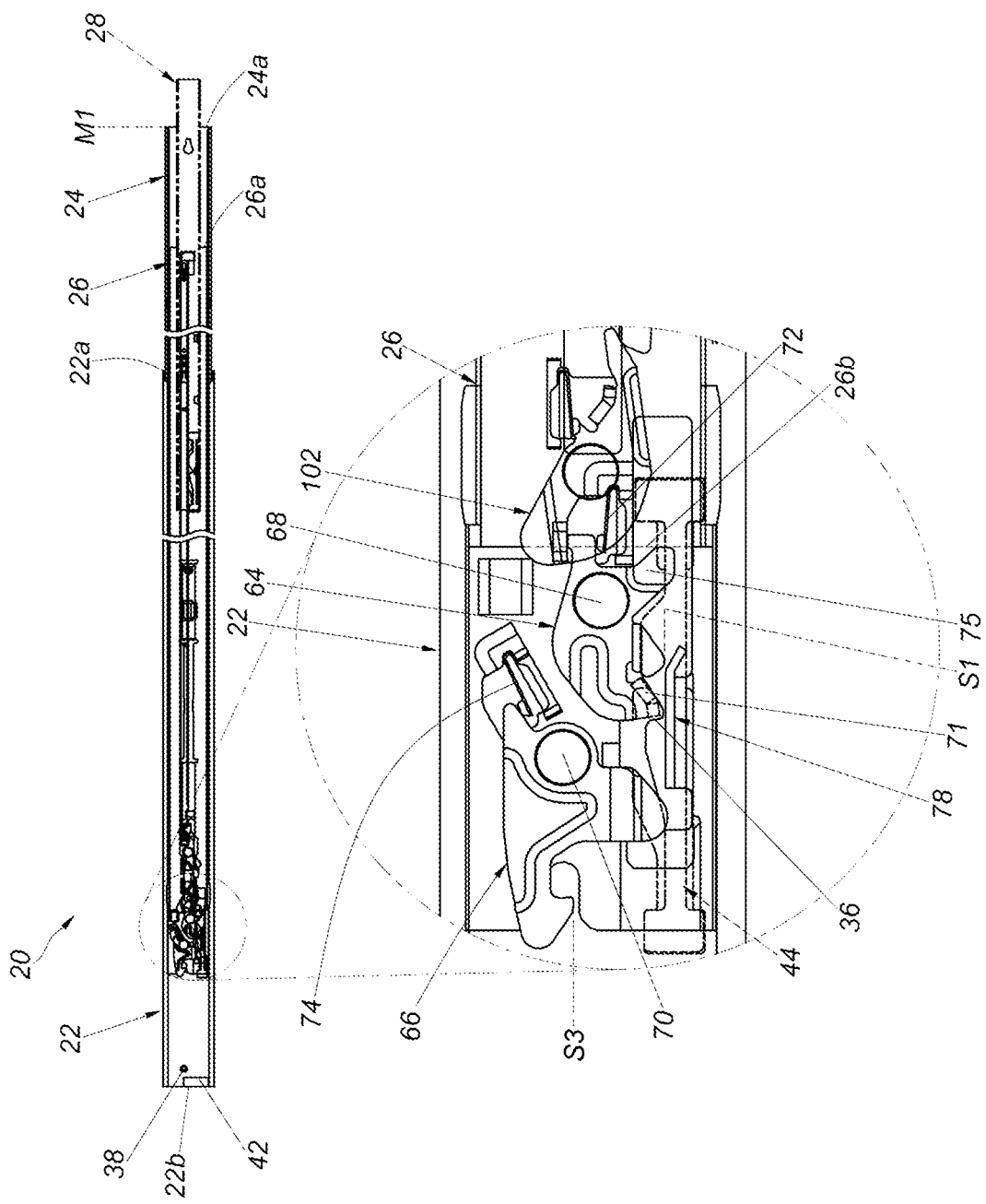
FIG. 12 is a diagram of the slide rail assembly as the second rail moves along the retracting direction to drive the second rail to abut against a first working member according to the embodiment of the present invention.
Figure 13:
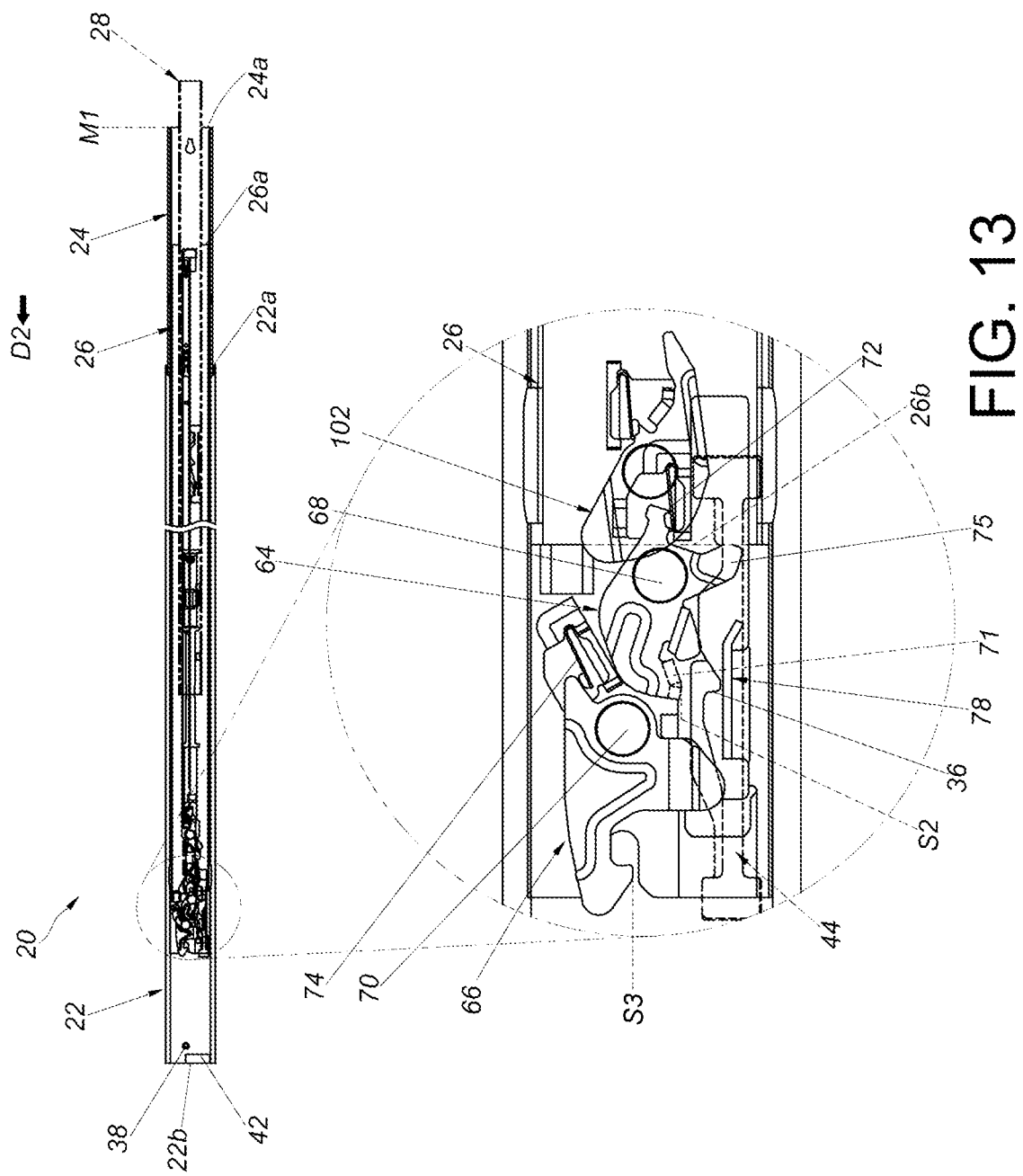
FIG. 13 is a diagram of the slide rail assembly as the second rail moves along the retracting direction to drive the first working member to move to a second state by an abutment of the second rail and the first working member according to the embodiment of the present invention.

When the first rail 24 is located at the first predetermined position M1 relative to the supporting frame 22, the second rail 26 can be moved along the retracting direction D2 from the extended position E to abut against the releasing portion 75 of the first working member 64 by the rear portion 26b for driving the first working member 64 to move from the first state S1 as shown in FIG. 12 to the second state S2 as shown in FIG. 13, such that the blocking structure 36 of the supporting frame 22 does not block the blocking portion 71 of the first working member in the second state S2 for allowing the first rail 24 to move along the retracting direction D2 from the first predetermined position M1 to a second predetermined position M2.

Figure 14:
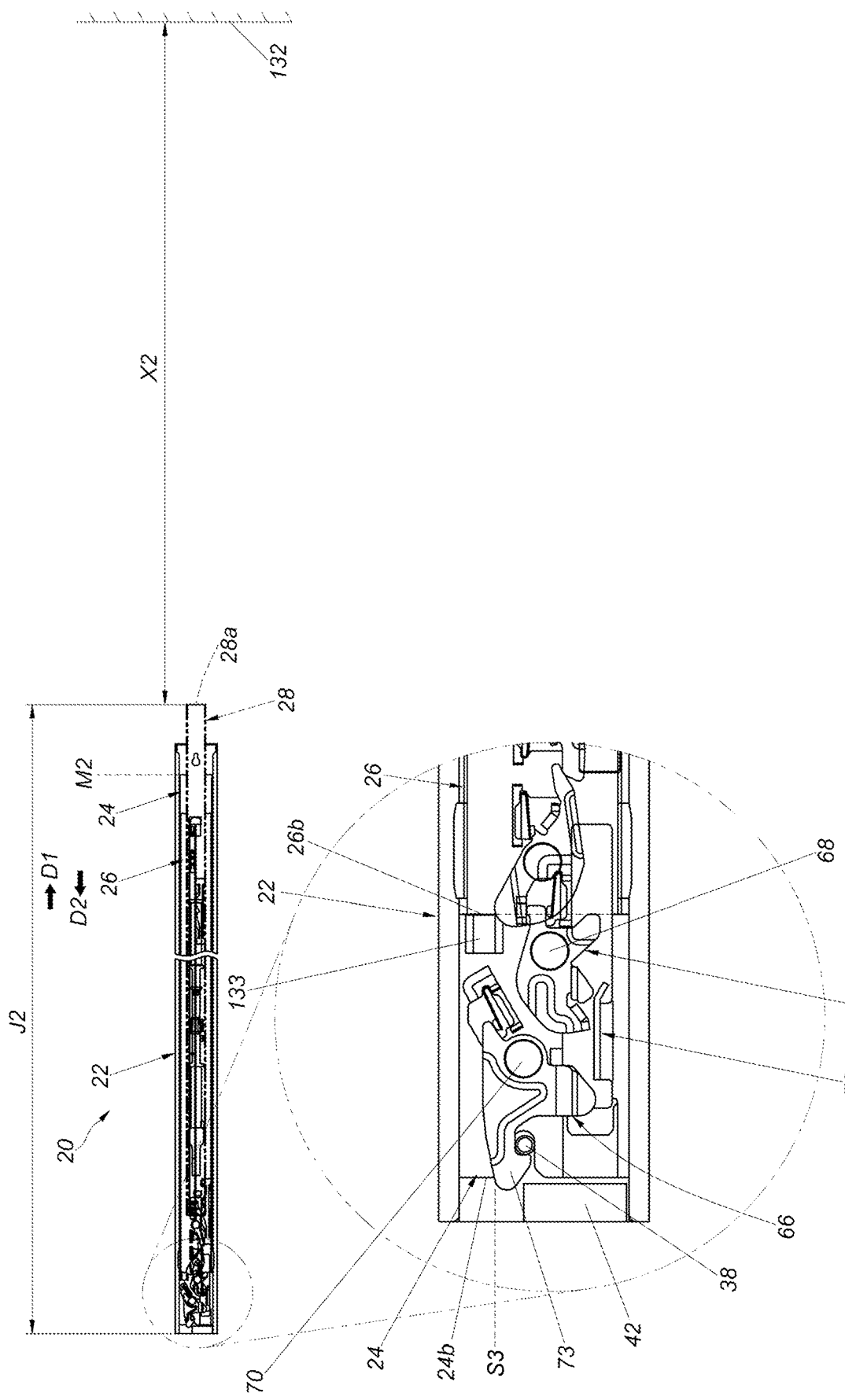
FIG. 14 is a diagram of the slide rail assembly as the first rail is locked at a second predetermined position according to the embodiment of the present invention.

As shown in FIG. 14, when the first rail 24 is located at the second predetermined position M2 relative to the supporting frame 22, the second working member 66, e.g., the positioning portion 73 of the second working member 66, in the third state S3 can engage with the positioning structure 38 of the supporting frame 22 for retaining the first rail 24 at the second predetermined position M2, so as to prevent the first rail 24 from moving along the opening direction D1 or the retracting direction D2 from the second predetermined position M2. When the first rail 24 is located at the second predetermined position M2, the slide rail assembly 20 has a second length J2 less than the first length J1, such that the front portion 28a of the third rail 28 is spaced apart from the object 132 by a second distance X2 greater than the first distance X1, which facilitates detachment of the third rail 28 from the second rail 26, e.g., the second channel 98 of the second rail 26, along the opening direction D1.

Preferably, when the first rail 24 is located at the second predetermined position M2 relative to the supporting frame 22, the rear restraining feature 42 of the supporting frame 22 can abut against the rear portion 24b of the first rail 24 for stopping the first rail 24. The first rail 24 further includes a restraining member 133 configured to abut against the rear porting 26b of the second rail 26 for stopping the second rail 26. When the restraining member 133 abuts against the rear porting 26b of the second rail 26, the second rail 26 is fully folded relative to the first rail 24.

Figure 15:
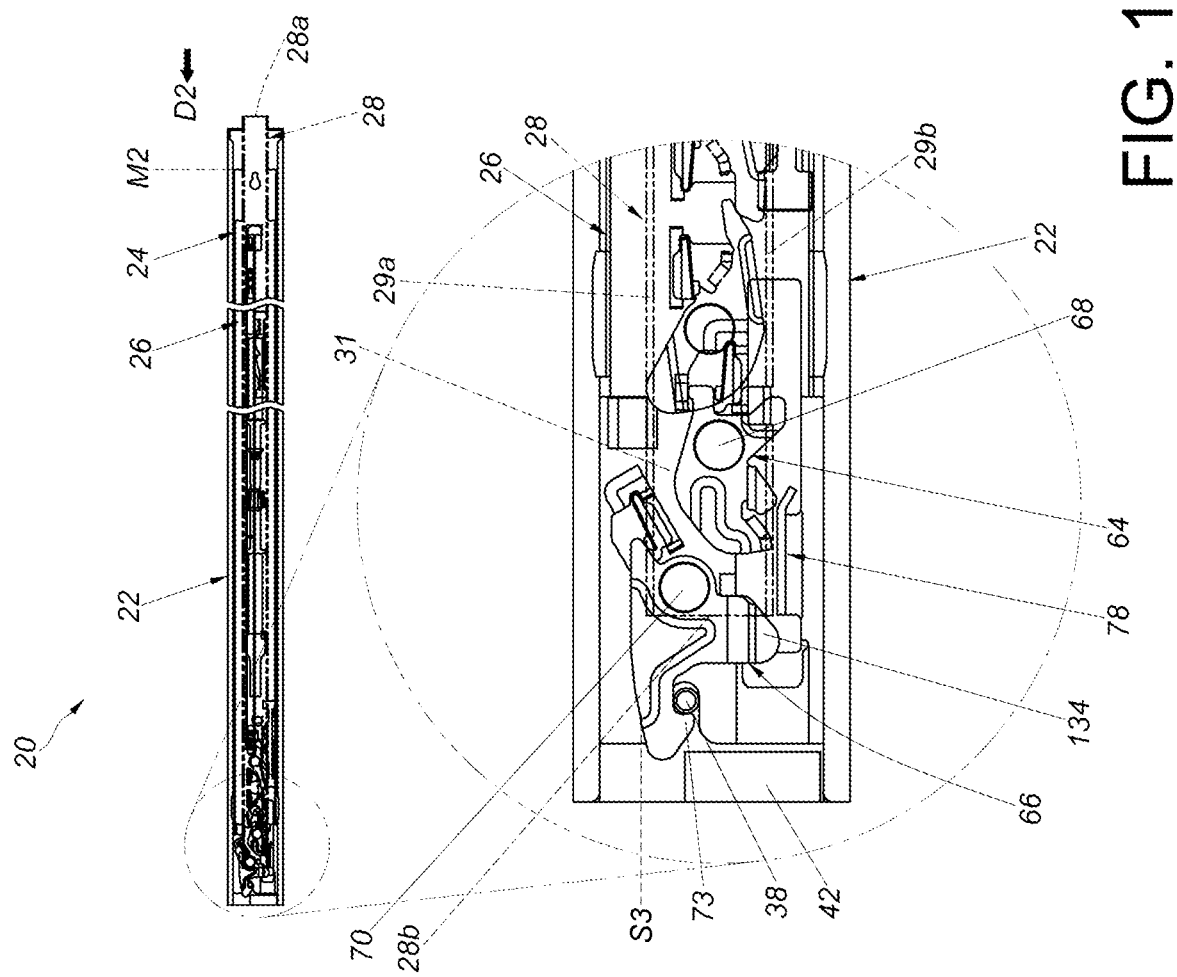
FIG. 15 is a diagram of the slide rail assembly as the third rail moves along the retracting direction to drive the third rail to abut against the second working member according to the embodiment of the present invention.
Figure 16:
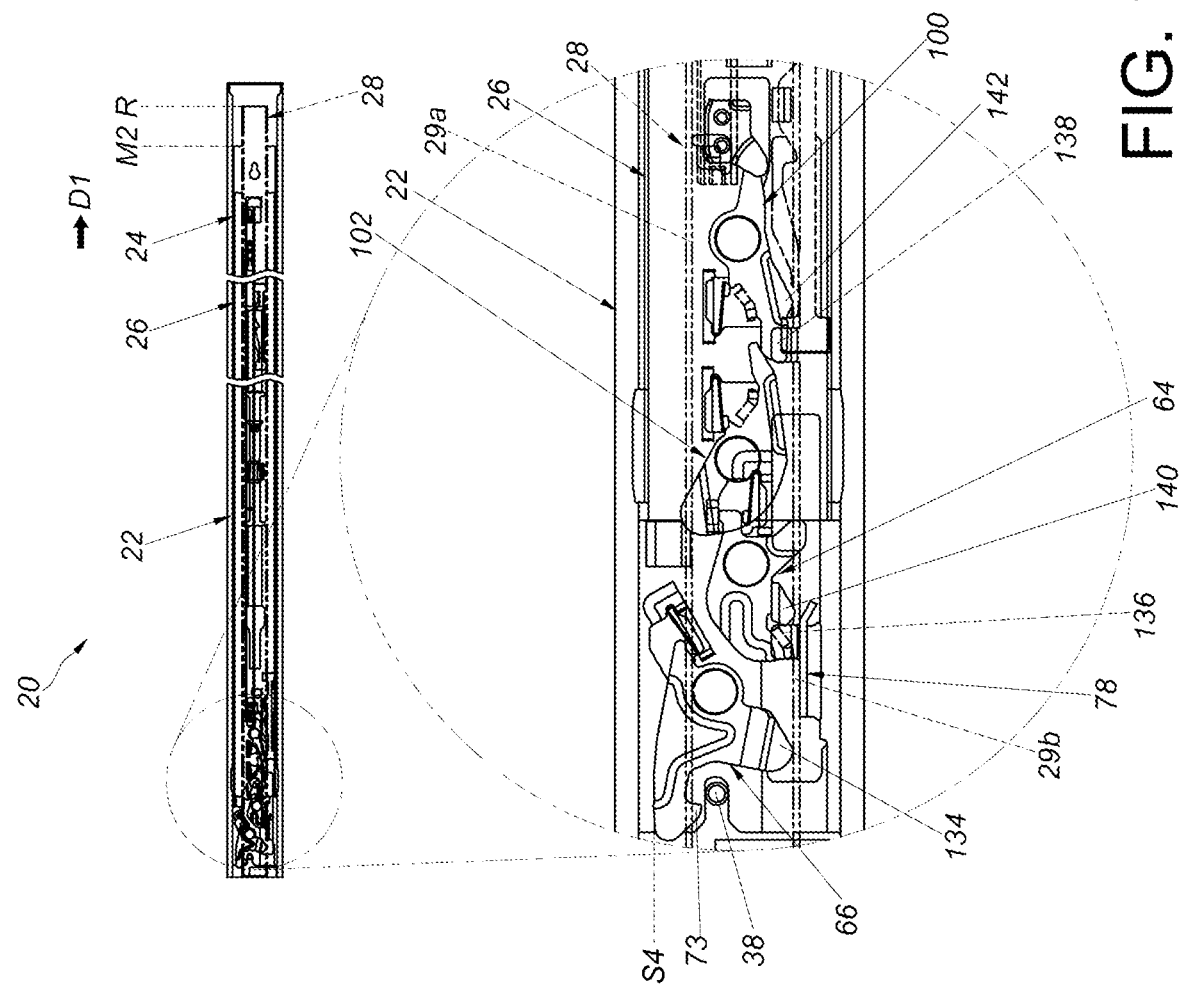
FIG. 16 is a diagram of the slide rail assembly as the third rail moves along the retracting direction to drive the second working member to move to a fourth state by an abutment of the third rail and the second working member according to the embodiment of the present invention.

As shown in FIG. 15 and FIG. 16, the third rail 28 further includes a first wall 29a, a second wall 29b and a longitudinal wall 31 connected between the first wall 29a and the second wall 29b of the third rail 28. When the second rail 26 is located at the second predetermined position M2 relative to the supporting frame 22 and the second rail 26 is fully folded relative to the first rail 24, the third rail 28 is movable relative to the first rail 24 along the retracting direction D2 to a retracted position R. During a movement of the third rail 28 relative to the first rail 24 along the retracting direction D2 to the retracted position R, a portion of the third rail 28, e.g., the rear portion 28 of the third rail 28, can abut against an auxiliary portion 134, which is shown in FIG. 15, of the second working member 66 in the third state S3 for driving the second working member 66 to pivot by an angle to move from the third state S3 as shown in FIG. 15 to the fourth state S4 as shown in FIG. 16. When the third rail 28 is located at the retracted position R relative to the first rail 24, the second wall 29b of the third rail 28 supports the second working member 66 for retaining the second working member 66 in the fourth state S4, such that the positioning portion 73 of the second working member 66 is not engaged with the positioning structure 38 of the supporting frame 22 for allowing the first rail 24 to move along the opening direction D1 from the second predetermined position M2.

Preferably, as shown in FIG. 16, when the third rail 28 is located at the retracted position R relative to the first rail 24, the supporting feature 78 of the first rail 24 is configured to support a portion of the second wall 29b of the third rail 28 adjacent to a rear rail section of the third rail 28 for enhancing a structural strength of the slide rail assembly 20.

Preferably, as shown in FIG. 16, the third rail 28 further includes a first synchronizing feature 136 and a second synchronizing feature 138. During a movement of the third rail 28 along the opening direction D1 from the retracted position R, the first synchronizing feature 136 of the third rail 28 can abut against a first corresponding feature 140 of the first working member 64 for driving the third rail 28 and the first rail 24 to move synchronously along the opening direction D1 until the first rail 24 moves to the first predetermined position M1. Besides, the second synchronizing feature 138 of the third rail 28 can abut against a second corresponding feature 142 of the third working member 100 for driving the third rail 28 and the second rail 26 to be moved synchronously along the opening direction D1 until the second rail 26 moves to the extended position E.

Figure 17:
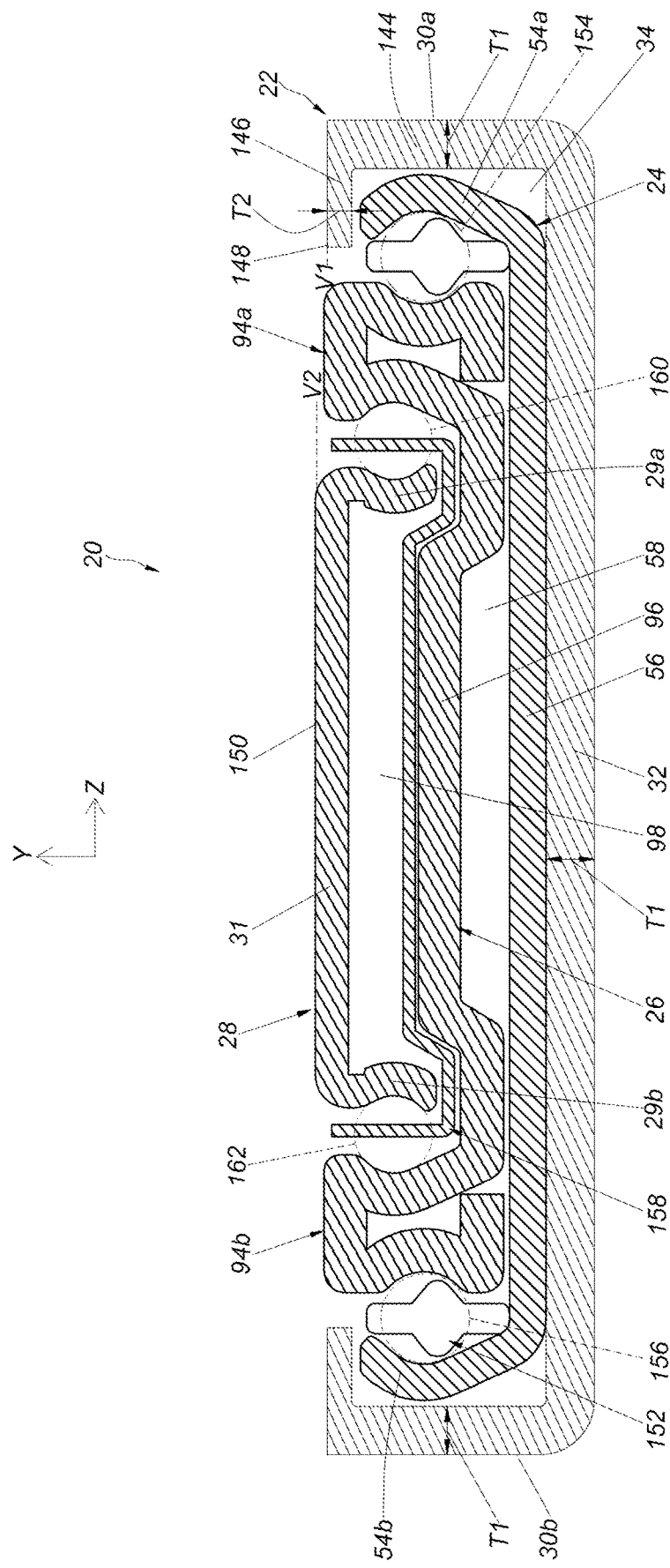
FIG. 17 is a partial section diagram of the slide rail assembly according to the embodiment of the present invention.

As shown in FIG. 17, the first wall 30a, the second wall 30b and the longitudinal wall 32 of the supporting frame 22 cooperatively define the supporting channel 34 of the supporting frame 22. Each of the first wall 30a and the second wall 30b has a first supporting portion 144 and a second supporting portion 146 bent from the first supporting portion 144. Each of the longitudinal wall 32 and the first supporting portions 144 of the supporting frame 22 has a first predetermined thickness T1. Each of the second supporting portions 146 has a second predetermined thickness T2 less than the first predetermined thickness T1. The first predetermined thickness T1 of the first supporting portion 144 extends along the Z axis. The first predetermined thickness T1 of the longitudinal wall 32 and the second predetermined thickness T2 of the second supporting portion 146 extend along the Y axis.

Preferably, each of the second supporting portions 146 of the supporting frame 22 includes a first surface 148. The longitudinal wall 31 of the third rail 28 includes a second surface 150. The first surfaces 148 and the second surface 150 are not coplanar. For example, the first surfaces 148 can be located on a first horizontal plane V1, and the second surface 150 can be located on a second horizontal plane V2 protruding out of the first horizontal plane V1, which facilitates mounting a carried object, which is not shown in the figures, on the third rail 28. In other words, the first surfaces 148 of the supporting frame 22 do not cause any interference with a mounting operation of the carried object on the third rail 28.

The first wall 54a, the second wall 54b and the longitudinal wall 56 of the first rail 24 cooperatively define the first channel 58 of the first rail 24. The first wall 30a, the second wall 30b and the longitudinal wall 32 of the supporting frame 22 are configured to at least partially cover the first wall 54a, the second wall 54b and the longitudinal wall 56 of the first rail 24 to support the first rail 24 for enhancing a supporting capability of the first rail 24.

Preferably, the first wall 94a, the second wall 94b and the longitudinal wall 96 of the second rail 26 cooperatively define the second channel 98 of the second rail 26.

Preferably, the slide rail assembly 20 further includes a first facilitating device 152 movably mounted between the first rail 24 and the second rail 26 for ensuring a smooth sliding movement of the second rail 26 relative to the first rail 24. The first facilitating device 152 at least includes a first roller 154 and a second roller 156. The first roller 154 is supported between the first wall 54a of the first rail 24 and the first wall 94a of the second rail 26. The second roller 156 is supported between the second wall 54b of the first rail 24 and the second wall 94b of the second rail 26.

Preferably, the slide rail assembly 20 further includes a second facilitating device 158 movably mounted between the second rail 26 and the third rail 28 for ensuring a smooth sliding movement of the third rail 28 relative to the second rail 26. The second facilitating device 158 at least includes a third roller 160 and a fourth roller 162. The third roller 160 is supported between the first wall 94a of the second rail 26 and the first wall 29a of the third rail 28. The fourth roller 162 is supported between the second wall 94b of the second rail 26 and the second wall 29b of the third rail 28.

From the above, the slide rail assembly 20 of the present invention has the following feature of that when the slide rail assembly 20 is in the extended state, the first rail 24 is located at the first predetermined position M1 relative to the supporting frame 22, the second rail 26 is located at the extended position E relative to the first rail 24, and the third rail 28 is located at the opened position K relative to the second rail 26 and the rear rail section r of the third rail 28 is overlapped with the front rail section f of the first rail 24, such that the front rail section f of the first rail 24 and the rear rail section r of the third rail 28 can support each other for enhancing the structural strength of the slide rail assembly 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly comprising:
a supporting frame;
a first rail movable relative to the supporting frame;
a second rail movable relative to the first rail; and
a third rail movable relative to the second rail;
wherein when the slide rail assembly is in an extended state, the first rail is located at a first predetermined position relative to the supporting frame, the second rail is located at an extended position relative to the first rail, the third rail is located at an opened position relative to the second rail and a rear rail section of the third rail is overlapped with a front rail section of the first rail;
wherein a blocking structure and a positioning structure are arranged on the supporting frame, a blocking feature and a positioning feature are arranged on the first rail, the second rail is movably mounted between the first rail and the third rail, the slide rail assembly further comprises a first working member and a second working member, the first working member is movably mounted to the first rail and switchable between a first state and a second state, the second working member is movably mounted to the first rail and switchable between a third state and a fourth state, when the first rail is located at the first predetermined position relative to the supporting frame, the blocking structure blocks the first working member in the first state for preventing the first rail from moving along a retracting direction from the first predetermined position, and when the first rail is located at a second predetermined position relative to the supporting frame, the second working member in the third state engages with the positioning structure for preventing the first rail from moving along an opening direction from the second predetermined direction.

2. The slide rail assembly of claim 1, wherein each of the supporting frame, the first rail, the second rail and the third rail comprises a front portion and a rear portion, the supporting frame further comprises a supporting channel configured to at least partially accommodate the first rail, the first rail further comprises a first channel configured to at least partially accommodate the second rail, and the second rail further comprises a second channel configured to at least partially accommodate the third rail.

3. The slide rail assembly of claim 2, wherein when the slide rail assembly is in the extended state, the front portion of the first rail extends beyond the front portion of the supporting frame, the front portion of the second rail extends beyond the front portion of the first rail, and the front portion of the third rail extends beyond the front portion of the second rail.

4. The slide rail assembly of claim 3, wherein when the slide rail assembly is in the extended state, the front portion of the second rail extends beyond the rear portion of the third rail.

5. The slide rail assembly of claim 2, wherein the supporting frame further comprises a first wall, a second wall and a longitudinal wall connected between the first wall and the second wall of the supporting frame, and the supporting channel is defined by the first wall, the second wall and the longitudinal wall of the supporting frame cooperatively.

6. The slide rail assembly of claim 5, wherein each of the first wall and the second wall of the supporting frame comprises a first supporting portion and a second supporting portion bent relative to the first supporting portion, each of the longitudinal wall of the supporting frame and the first supporting portion has a first predetermined thickness, and the second supporting portion has a second predetermined thickness less than the first predetermined thickness.

7. The slide rail assembly of claim 6, wherein the first rail further comprises a first wall, a second wall and a longitudinal wall connected between the first wall and the second wall of the first rail, the first channel is defined by the first wall, the second wall and the longitudinal wall of the first rail cooperatively, and the first wall, the second wall and the longitudinal wall of the supporting frame are configured to at least partially cover the first wall, the second wall and the longitudinal wall of the first rail.

8. The slide rail assembly of claim 7, wherein the second rail further comprises a first wall, a second wall and a longitudinal wall connected between the first wall and the second wall of the second rail, the second channel is defined by the first wall, the second wall and the longitudinal wall of the second rail cooperatively, and the third rail further comprises a first wall, a second wall and a longitudinal wall connected between the first wall and the second wall of the third rail.

9. The slide rail assembly of claim 8, wherein the second supporting portion comprises a first surface, the longitudinal wall of the third rail comprises a second surface, and the first surface and the second surface are not coplanar.

10. The slide rail assembly of claim 1, wherein the first working member and the second working member are pivotally connected to the first rail, and the slide rail assembly further comprises a first resilient member and a second resilient member respectively configured to provide resilient forces to the first working member and the second working member.

11. The slide rail assembly of claim 1, wherein when the first rail is located at the first predetermined position relative to the supporting frame and the first working member moves from the first state to the second state, the blocking structure does not block the first working member in the second state for allowing the first rail to move along the retracting direction from the first predetermined position to the second predetermined position.

12. The slide rail assembly of claim 1, wherein when the first rail is located at the second predetermined position relative to the supporting frame and the third rail is located at a retracted position relative to the first rail, the third rail is configured to support the second working member, such that the second working member is retained in the fourth state and does not engage with the positioning structure for allowing the first rail to move along the opening direction from the second predetermined position.

13. The slide rail assembly of claim 12, wherein a supporting feature is arranged on the first rail and configured to support the third rail when the third rail is located at the retracted position relative to the first rail.

14. The slide rail assembly of claim 12, wherein the third rail comprises a synchronizing feature, and the synchronizing feature abuts against the first working member for allowing the third rail and the first rail to move along the opening direction synchronously during a movement of the third rail along the opening direction from the retracted position.

* * * * *